(12) United States Patent (10) Patent No.: US 7,952,395 B2
Abuelma'atti et al. (45) Date of Patent: May 31, 2011

(54) UNIVERSAL CMOS CURRENT-MODE ANALOG FUNCTION SYNTHESIZER

(75) Inventors: Muhammad Taher Abuelma'atti, Dhahran (SA); Nawal Mansour Al-Yahia, Dammam (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 12/588,351

(22) Filed: Oct. 13, 2009

(65) Prior Publication Data

US 2011/0084732 A1 Apr. 14, 2011

(51) Int. Cl.
*H03B 21/00* (2006.01)
(52) U.S. Cl. .............................. 327/105; 708/8; 708/845
(58) Field of Classification Search .................. 327/100, 327/105, 106, 107; 708/8, 845
See application file for complete search history.

(56) References Cited

U.S. PATENT DOCUMENTS

| | | | |
|---|---|---|---|
| 3,022,009 A * | 2/1962 | Fogarty | 708/854 |
| 3,349,379 A | 10/1967 | Bartlett | |
| 3,636,338 A * | 1/1972 | Abnett et al. | 708/846 |
| 3,688,098 A * | 8/1972 | Cwynar et al. | 708/811 |
| 3,894,224 A | 7/1975 | Korteling | |
| 4,021,648 A * | 5/1977 | Sakata | 708/845 |
| 4,204,261 A | 5/1980 | Ruszala et al. | |
| 4,454,486 A | 6/1984 | Hassun et al. | |
| 5,446,676 A | 8/1995 | Huang et al. | |
| 6,581,085 B1 * | 6/2003 | Yue et al. | 708/502 |
| 6,898,616 B2 | 5/2005 | Hirafuji | |
| 7,096,168 B2 | 8/2006 | Scherr | |
| 7,138,824 B1 | 11/2006 | Bakker et al. | |
| 7,328,143 B2 | 2/2008 | McGaughy | |
| 7,514,980 B2 * | 4/2009 | Choi et al. | 327/346 |
| 2003/0004700 A1 | 1/2003 | Scherr | |
| 2008/0140755 A1 * | 6/2008 | Remy et al. | 708/845 |

FOREIGN PATENT DOCUMENTS

DE 128831 A 12/1977
DE 19651502 A1 6/1998

OTHER PUBLICATIONS

Current-Mode Techniques in the Synthesis and Applications of Analog and Multi-Valued Logic in Mixed Signal Design. Two pages from the Internet Feb. 25, 2009 http://biblioteca.universia.net/ficha.do?id.37680240.

* cited by examiner

*Primary Examiner* — Lincoln Donovan
*Assistant Examiner* — William Hernandez
(74) *Attorney, Agent, or Firm* — Richard C. Litman

(57) ABSTRACT

The universal CMOS current-mode analog function synthesizer is based on approximating the required function using its sixth-order Taylor series expansion. These approximations can be implemented by adding the weighted output currents of a number of basic building blocks built around a basic current squarer, and a constant current. The circuit can simultaneously realize thirty-two different mathematical functions and can be easily expanded to accommodate many others.

10 Claims, 19 Drawing Sheets

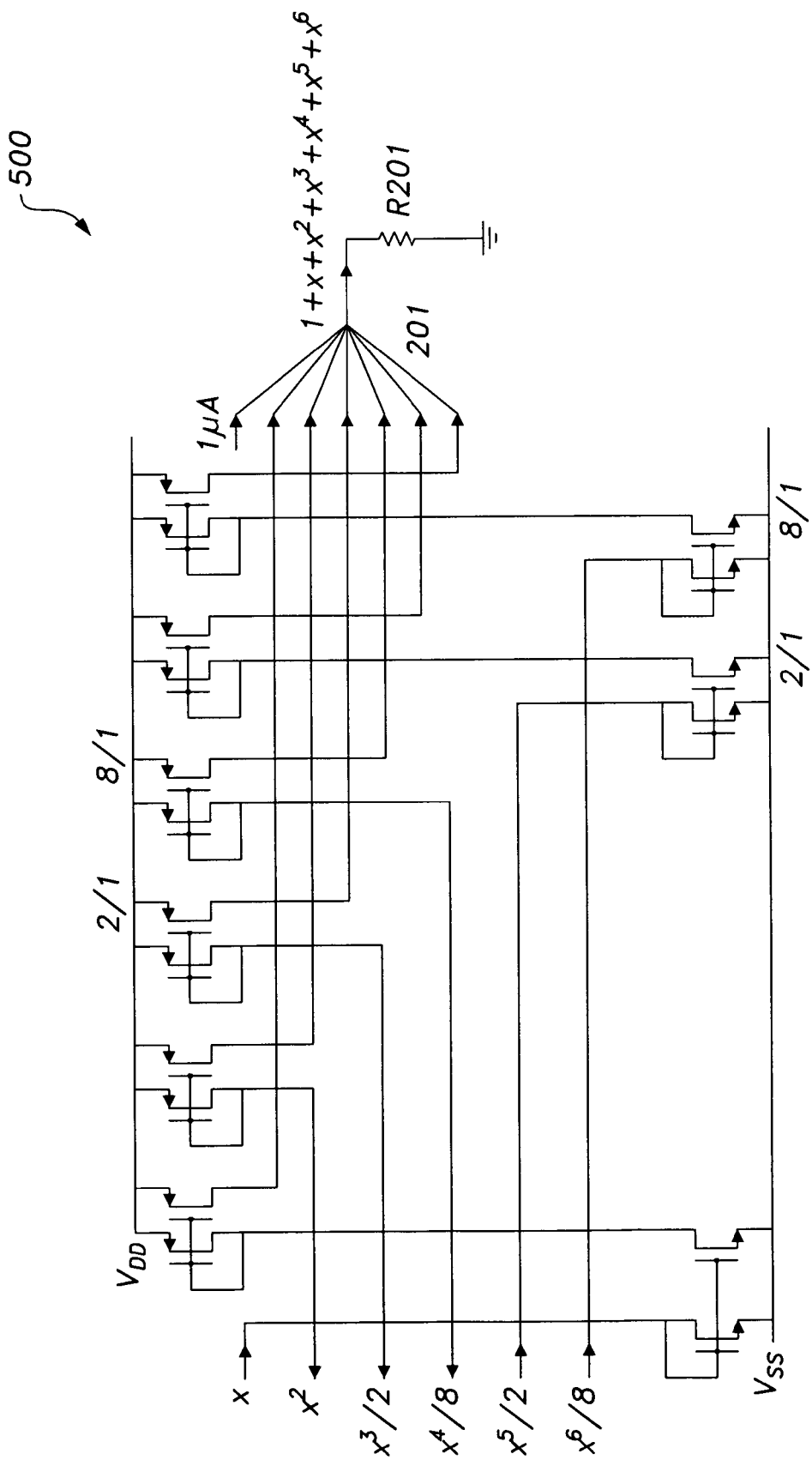

UNIVERSAL CMOS CURRENT-MODE ANALOG FUNCTION SYNTHESIZER

BACKGROUND OF THE INVENTION

1. Field of the Invention

The present invention relates generally to analog function synthesizers, and particularly to a universal CMOS current mode analog function synthesizer that can realize over thirty-two nonlinear functions using a transistor squaring unit without dedicated current multipliers.

2. Description of the Related Art

The use of analog nonlinear networks, signal processing and medical equipment justifies the large number of analog nonlinear function synthesizers available in the literature. Over the years, different approaches have been used for synthesizing nonlinear functions. Initially, diodes and linear resistors were extensively used. Later on, the nonlinear characteristics of MOSFETs operated in weak or strong inversion regions and JFETs operated in the pinch-off or the triode region have been exploited in realizing various analog functions including the exponential, the squarer and the square rooting functions. Recently, the realization of nonlinear functions using piecewise-linear function approximations and integrated-circuit operational amplifiers, current conveyors, operational transconductance amplifiers and current comparators has been reported.

The exponential characteristic of the bipolar junction transistor has been exploited to advantage in the design of analog nonlinear functions using the translinear principle. Design of analog BiCMOS computational circuits has also been reported.

Over the years analog CMOS circuits have evolved based on the exponential law characteristic of a MOS transistor operating in weak inversion. Moreover, the square-law characteristic of a MOS transistor operating in strong inversion has been reported. Voltage multipliers, linear voltage-to-current and current-to-voltage converters, exponential and pseudo exponential current-to-voltage, voltage-to-current, voltage-to-voltage converters, vector-summation circuits, sin (x) shapers, square-rooters, arc sine function and arc cosine function are several examples of the analog nonlinear CMOS circuit realizations available in the literature. These circuit realizations suffer from many disadvantages. For example, the related art circuit realizations may permit only one function realization at a time. They may require numerical optimization routines to select the device size ratios and the bias voltages. They may use piecewise linear approximations for synthesizing the nonlinear functions. They may require programming of the parameters of several circuits. They may operate in voltage-mode with input and output voltages or mixed-mode with voltages as the input or output and current as output or input.

Current-mode circuits, with currents as input and output variables, are more attractive than their voltage-mode counterparts. This is attributed to wider signal bandwidths and larger dynamic ranges of operation that can be obtained using current-mode circuits rather than voltage-mode circuits.

Although a number of CMOS current-mode analog function synthesizers are available these circuits suffer from disadvantages such as, e.g., they may use piecewise linear approximations for synthesizing nonlinear functions; they may provide only a few functions (mostly the exponential or the pseudo exponential functions); they may extensively use integrated circuits such as operational transconductance amplifiers and current comparators; they may require digital control circuits to select the required function; they may realize only one function at a time.

Recently, a universal CMOS current-mode analog function synthesizer has been proposed. The key idea of the proposed circuit is the fact that numerous nonlinear functions can be approximated, to a high degree of accuracy, using a few terms of their Taylor series expansion.

Although a number of dedicated current multipliers are already available, current multipliers usually suffer from limited bandwidth, complexity leading to high power consumption, the need to trim out the feed-through terms (offset currents) and to adjust the scale factor (the multiplier gain).

It therefore would be desirable to present a new universal CMOS current-mode analog function synthesizer that can realize a wide range of nonlinear functions without recourse to dedicated current multipliers.

Thus, a universal CMOS current-mode analog function synthesizer solving the aforementioned problems is desired.

SUMMARY OF THE INVENTION

The universal CMOS current-mode analog function synthesizer is based on approximating the required function using a sixth-order Taylor series expansion of the function. These approximations can be implemented by adding the weighted output currents of a number of basic building blocks, built around a basic current squarer, and a constant current. The circuit can simultaneously realize thirty-two different mathematical functions and can be easily expanded to accommodate many others. Simulation results have verified the accuracy and performance of the synthesizer circuit.

The synthesizer circuit enjoys the following attractive features: (1) the circuit uses CMOS transistors and is, therefore, compatible with the current digital signal processing CMOS technology; (2) CMOS transistors work in the strong inversion, thus operation at relatively high frequency is feasible; (3) the circuit can simultaneously realize several nonlinear functions; (4) the circuit does not require any programming for its bias voltages or currents and parameter optimization is not required; (5) the circuit avoids the use of piecewise linear approximation of the synthesized nonlinear functions; and (6) the circuit operates in current-mode, thus providing higher frequencies of operation and wider dynamic ranges.

These and other features of the present invention will become readily apparent upon further review of the following specification and drawings.

BRIEF DESCRIPTION OF THE DRAWINGS

FIG. 5 is a block diagram of a y=1/(1−x) portion of the 32-by-32 function generator circuit.

Similar reference characters denote corresponding features consistently throughout the attached drawings.

DETAILED DESCRIPTION OF THE PREFERRED EMBODIMENTS

Figure 1:
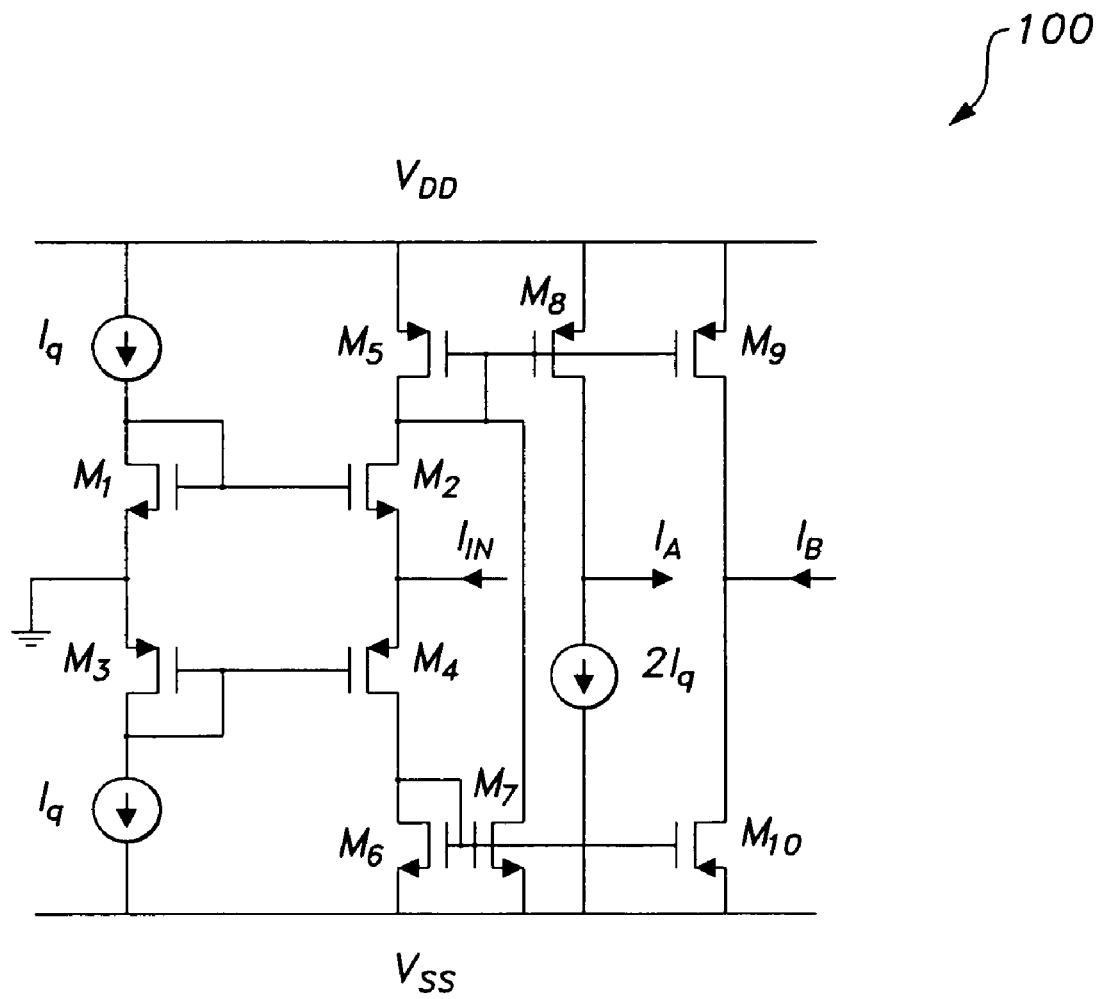
FIG. 1 is a block diagram of a class AB current mirror and its modification to provide current squarer and current proportional to the input current of a universal CMOS current-mode analog function synthesizer according to the present invention.

The universal CMOS current-mode analog function synthesizer (shown in FIGS. 4A through 4D as circuitry 400a through 400d) is based on approximating the required function using a sixth-order Taylor series expansion of the function. These approximations can be implemented by adding the weighted output currents of a number of basic building blocks, which are built around a basic current squarer and a constant current. The circuitry 400a through 400d can simultaneously realize thirty-two different mathematical functions and can be easily expanded to accommodate many others.

The universal CMOS current-mode analog function synthesizer circuitry 400a-400d approximates numerous nonlinear functions to a high degree of accuracy by using the first seven terms of a Taylor series expansion of the form:

TABLE I

| $f(x) \cong y = a_0 + a_1 x + a_2 x^2 + a_3 x^3 + a_4 x^4 + a_5 x^5 + a_6 x^6; |x| < 1$ (1) | | | | | | | |
|---|---|---|---|---|---|---|---|
| Node no. | function | $a_0$ | $a_1$ | $a_2$ | $a_3$ | $a_4$ | $a_5$ | $a_6$ |
| 201 | $\frac{1}{1-x}$ | 1 | 1 | 1 | 1 | 1 | 1 | 1 |
| 202 | $\frac{1}{1+x}$ | 1 | −1 | 1 | −1 | 1 | −1 | 1 |
| 203 | $\frac{1}{1-x^2}$ | 1 | 0 | 1 | 0 | 1 | 0 | 1 |
| 204 | $\frac{1}{1+x^2}$ | 1 | 0 | −1 | 0 | 1 | 0 | −1 |
| 205 | $\sqrt{1-x}$ | 1 | $-\frac{1}{2}$ | $-\frac{1}{8}$ | $-\frac{1}{16}$ | $-\frac{5}{128}$ | $-\frac{7}{256}$ | $-\frac{21}{1024}$ |
| 206 | $\sqrt{1+x}$ | 1 | $\frac{1}{2}$ | $-\frac{1}{8}$ | $\frac{1}{16}$ | $-\frac{5}{128}$ | $\frac{7}{256}$ | $-\frac{21}{1024}$ |
| 207 | $\frac{1}{\sqrt{1-x}}$ | 1 | $\frac{1}{2}$ | $\frac{3}{8}$ | $\frac{5}{16}$ | $\frac{35}{128}$ | $\frac{63}{256}$ | $\frac{231}{1024}$ |
| 208 | $\frac{1}{\sqrt{1+x}}$ | 1 | $-\frac{1}{2}$ | $\frac{3}{8}$ | $-\frac{5}{16}$ | $\frac{35}{128}$ | $-\frac{63}{256}$ | $\frac{231}{1024}$ |
| 209 | $\sqrt{1-x^2}$ | 1 | 0 | $-\frac{1}{2}$ | 0 | $-\frac{1}{8}$ | 0 | $-\frac{19}{240}$ |
| 210 | $\sqrt{1+x^2}$ | 1 | 0 | $\frac{1}{2}$ | 0 | $-\frac{1}{12}$ | 0 | $\frac{1}{24}$ |
| 211 | sin(x) | 0 | 1 | 0 | $-\frac{1}{6}$ | 0 | $\frac{1}{120}$ | 0 |
| 212 | tan(x) | 0 | 1 | 0 | $\frac{1}{3}$ | 0 | $\frac{2}{15}$ | 0 |
| 213 | cos(x) | 1 | 0 | $-\frac{1}{2}$ | 0 | $\frac{1}{24}$ | 0 | $-\frac{1}{720}$ |
| 214 | sinh(x) | 0 | 1 | 0 | $\frac{1}{6}$ | 0 | $\frac{1}{120}$ | 0 |

TABLE I-continued $$f(x) \cong y = a_0 + a_1x + a_2x^2 + a_3x^3 + a_4x^4 + a_5x^5 + a_6x^6; |x| < 1 \quad (1)$$

| Node no. | function | $a_0$ | $a_1$ | $a_2$ | $a_3$ | $a_4$ | $a_5$ | $a_6$ |
|---|---|---|---|---|---|---|---|---|
| 215 | $\tanh(x)$ | 0 | 1 | 0 | $-\frac{1}{3}$ | 0 | $\frac{2}{15}$ | 0 |
| 216 | $\cosh(x)$ | 1 | 0 | $\frac{1}{2}$ | 0 | $\frac{1}{24}$ | 0 | $\frac{1}{720}$ |
| 217 | $\sin^{-1}(x)$ | 0 | 1 | 0 | $\frac{1}{6}$ | 0 | $\frac{3}{40}$ | 0 |
| 218 | $\tan^{-1}(x)$ | 0 | 1 | 0 | $-\frac{1}{3}$ | 0 | $\frac{1}{5}$ | 0 |
| 219 | $\cos^{-1}(x)$ | $\frac{\pi}{2}$ | $-1$ | 0 | $-\frac{1}{6}$ | 0 | $-\frac{3}{40}$ | 0 |
| 220 | $\sec(x)$ | 1 | 0 | $\frac{1}{2}$ | 0 | $\frac{5}{24}$ | 0 | $\frac{61}{720}$ |
| 221 | $\sin(x^2)$ | 0 | 0 | 1 | 0 | 0 | 0 | $-\frac{1}{6}$ |
| 222 | $\cos(x^2)$ | 1 | 0 | 0 | 0 | $-\frac{1}{2}$ | 0 | 0 |
| 223 | $J_0(x)$ | 1 | 0 | $-\frac{1}{4}$ | 0 | $\frac{1}{64}$ | 0 | $-\frac{1}{2304}$ |
| 224 | $J_1(x)$ | 0 | $\frac{1}{2}$ | 0 | $-\frac{1}{16}$ | 0 | $\frac{1}{384}$ | 0 |
| 252 | $I_0(x)$ | 1 | 0 | $\frac{1}{4}$ | 0 | $\frac{1}{64}$ | 0 | $\frac{1}{2304}$ |
| 226 | $\ln(1-x)$ | 0 | $-1$ | $-\frac{1}{2}$ | $-\frac{1}{3}$ | $-\frac{1}{4}$ | $-\frac{1}{5}$ | $-\frac{1}{6}$ |
| 227 | $\ln(1+x)$ | 0 | 1 | $-\frac{1}{2}$ | $\frac{1}{3}$ | $-\frac{1}{4}$ | $\frac{1}{5}$ | $-\frac{1}{6}$ |
| 228 | $\ln\left[\frac{1+x}{1-x}\right]$ | 0 | 2 | 0 | $\frac{2}{3}$ | 0 | $\frac{2}{5}$ | 0 |
| 229 | $e^x$ | 1 | 1 | $\frac{1}{2}$ | $\frac{1}{6}$ | $\frac{1}{24}$ | $\frac{1}{120}$ | $\frac{1}{720}$ |
| 230 | $e^{-x}$ | 1 | $-1$ | $\frac{1}{2}$ | $-\frac{1}{6}$ | $\frac{1}{24}$ | $-\frac{1}{120}$ | $\frac{1}{720}$ |
| 231 | $e^{x^2}$ | 1 | 0 | 1 | 0 | $\frac{1}{2}$ | 0 | $\frac{1}{6}$ |
| 232 | $e^{-x^2}$ | 1 | 0 | $-1$ | 0 | $\frac{1}{2}$ | 0 | $-\frac{1}{6}$ |

Table I shows a number of nonlinear functions with the corresponding values of the parameters $a_n$, $n=0, 1, 2, \ldots, 6$. In current mode, with the variable x representing the normalized input current, Equation (1) can be implemented by adding the weighted output currents of a number of power-factor raising circuits with power factors=2, 3, ... 6, current amplifiers (or attenuators) and a constant current. In the function synthesizer circuit shown in FIGS. 4A through 4D, the power-factor raising circuits and the current amplifiers (or attenuators) are constructed via successive use of the traditional class-AB current mirror 100, shown in FIG. 1.

Table II shows the aspect ratios (W/L) of transistors $M_1$-$M_{10}$ of current mirror 100.

TABLE II

| Transistor | W/L |
|---|---|
| $M_1$ | 1/1 |
| $M_2$ | 1/1 |
| $M_3$ | 1/1 |
| $M_4$ | 1/1 |

TABLE II-continued

| Transistor | W/L |
|---|---|
| $M_5$ | 1/1 |
| $M_6$ | 1/1 |
| $M_7$ | 1/1 |
| $M_8$ | 1/1 |
| $M_9$ | 1/2 |
| $M_{10}$ | 1/1 |

Assuming that transistors $M_1$ $M_2$ as well as transistors $M_3$ and $M_4$ are well matched and that all transistors are operating in their saturation region and having the same value of the process transconductance parameter, i.e., $\beta_n = \beta_p$, then applying the translinear principle, we obtain:

$$2\sqrt{I_q} = \sqrt{I_{D2}} + \sqrt{I_{D4}} \quad (2)$$

where the currents $I_{D2}$ and $I_{D4}$ are the drain currents of transistors $M_2$ and $M_4$, respectively. Combining Equation (2) with:

$$I_{D2} + I_{in} = I_{D4} \quad (3)$$

and using simple mathematical manipulations, the currents $I_{D2}$ and $I_{D4}$ can be expressed as:

$$\frac{I_{D2}}{I_q} = 1 - \frac{1}{2}\frac{I_{in}}{I_q} + \left(\frac{I_{in}}{4I_q}\right)^2 \quad (4)$$

and $$\frac{I_{D4}}{I_q} = 1 + \frac{1}{2}\frac{I_{in}}{I_q} + \left(\frac{I_{in}}{4I_q}\right)^2. \quad (5)$$

From Equations (4) and (5), the current $I_{D5}$ and the output current $I_B$ can be expressed as:

$$\frac{I_{D5}}{I_q} = \frac{I_{D2} + I_{D4}}{I_q} = 2 + \frac{1}{8}\left(\frac{I_{in}}{I_q}\right)^2 \quad (6)$$

and $$\frac{I_B}{I_q} = \frac{\frac{1}{2}I_{D5} - I_{D4}}{I_q} = -\frac{1}{2}\frac{I_{in}}{I_q} \quad (7)$$

By subtracting a constant current=$2I_q$ from $I_{D5}$, the output current $I_A$ can be expressed as:

$$\frac{I_A}{I_q} = \frac{1}{8}\left(\frac{I_{in}}{I_q}\right)^2 \quad (8)$$

From Equations (7) and (8) it appears that the currents $I_B$ and $I_A$ are proportional to the normalized input-current $$x = \frac{I_{in}}{I_q}$$

and the square of the normalized input current $$x^2 = \left(\frac{I_{in}}{I_q}\right)^2$$

respectively.

Figure 2:
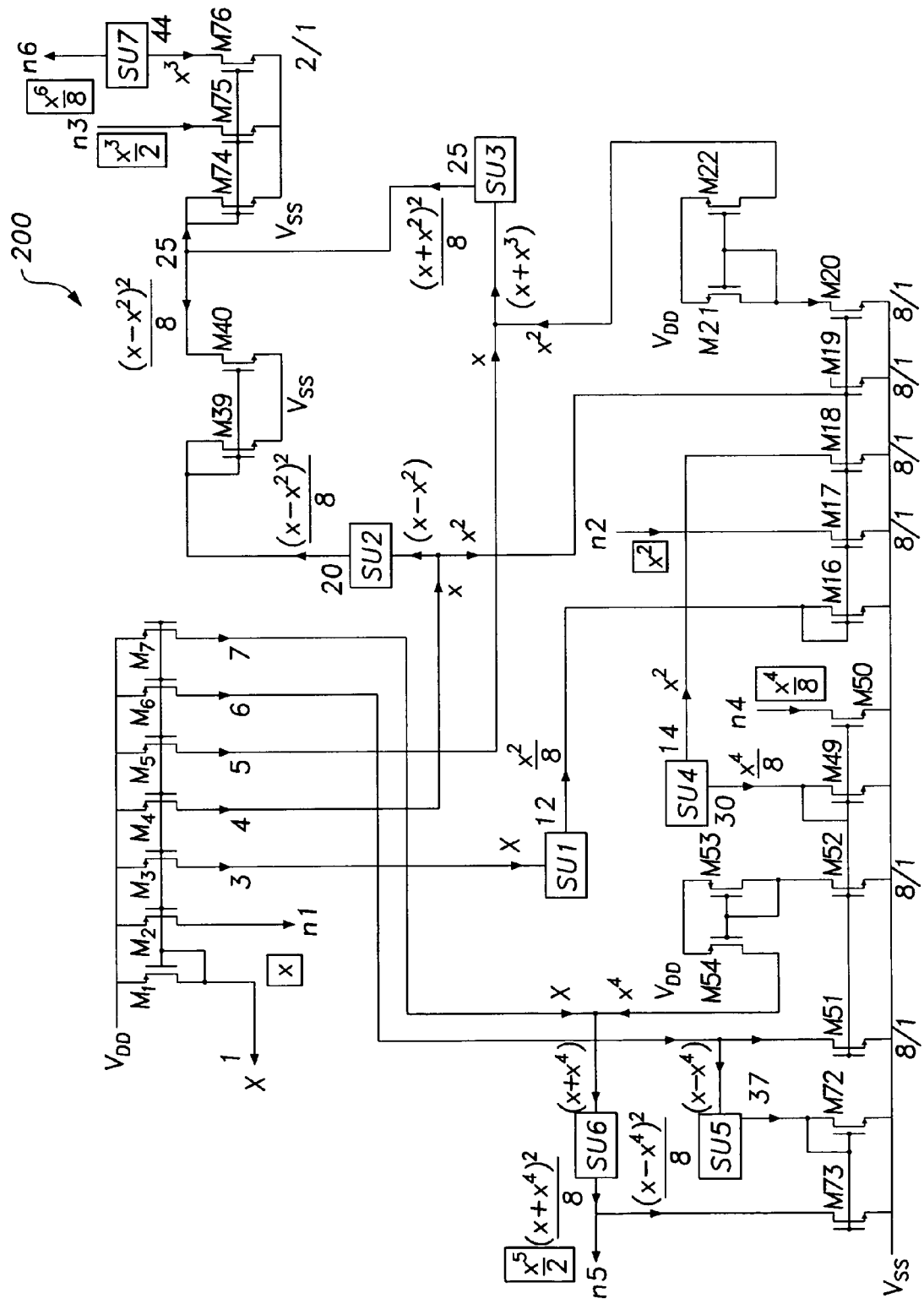
FIG. 2 is a block diagram for realizing the functions $$x, x^2, \frac{1}{2}x^3, \frac{1}{8}x^4, \frac{1}{2}x^5 \text{ and } \frac{1}{8}x^6.$$

As shown in FIG. 2, using additional current-mirrors with MOSFETs having different values of the aspect ratio W/L, these two currents can be used to obtain any current of value $a_1 x$ or $a_2 x^2$ where $a_1$ and $a_2$ are constants. Moreover, a normalized current proportional to $x^3$ can be obtained by using the square-difference identity $\lfloor (A+B)^2 - (A-B)^2 = 4AB \rfloor$. First, the sum and difference of the inputs $A=x$ and $B=x^2$ are provided for the Squaring Unit (SU) derived from FIG. 1 and shown in FIG. 3.

Figure 3:
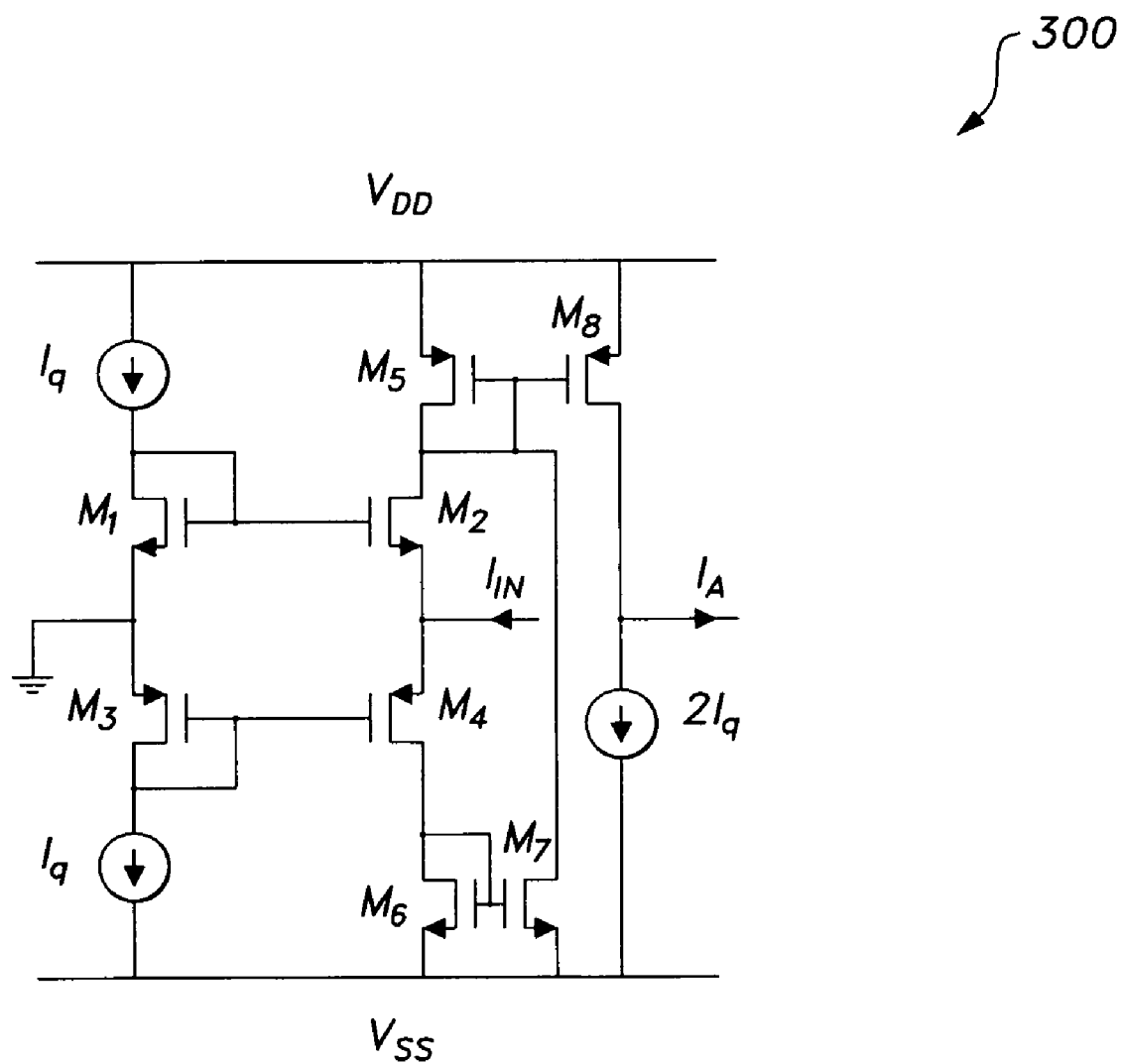
FIG. 3 is a block diagram of a squaring circuit.
Figure 4A:
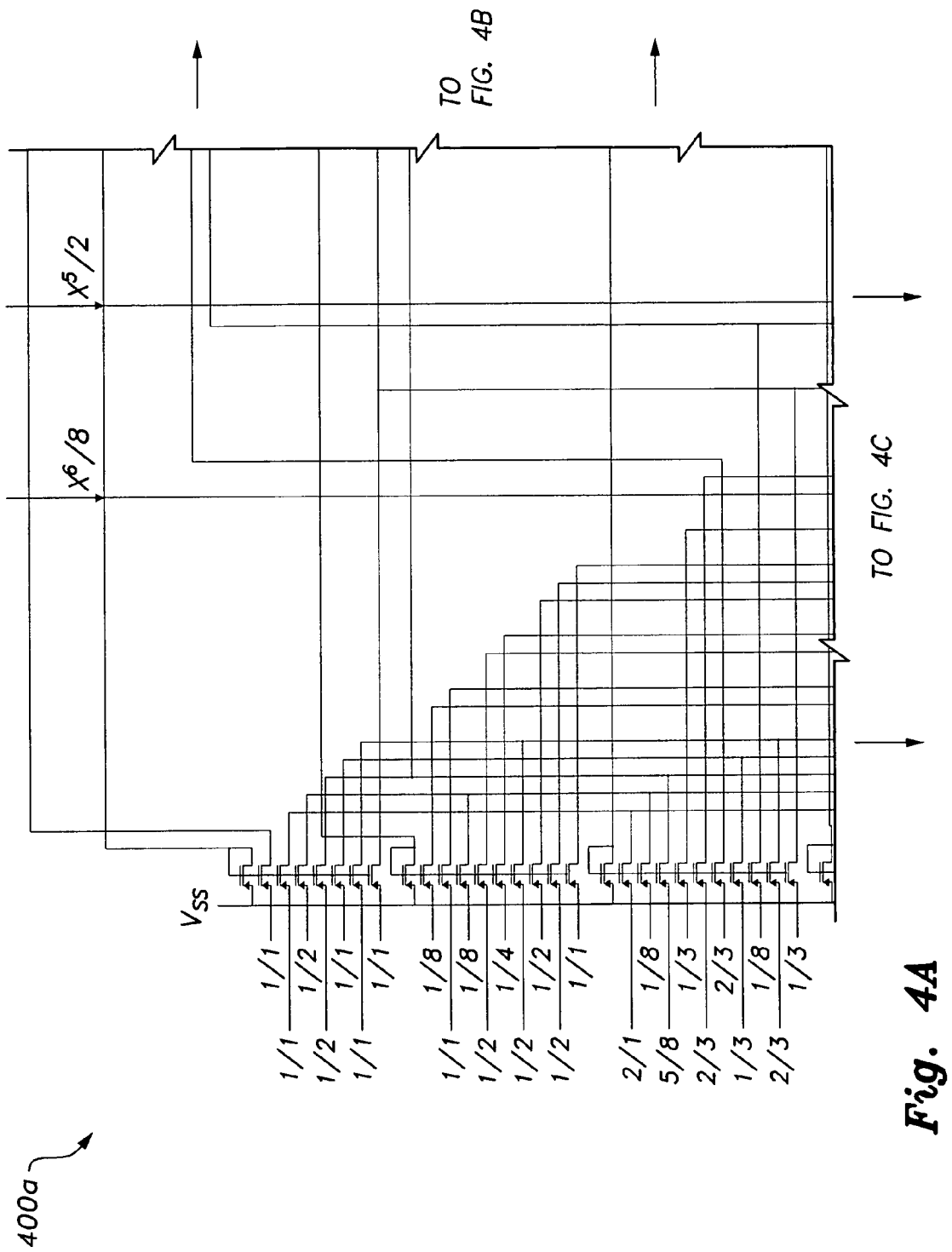
FIGS. 4A, 4B, 4C, and 4D together form a block diagram of a 32-by-32 function generator circuit.
Figure 4B:
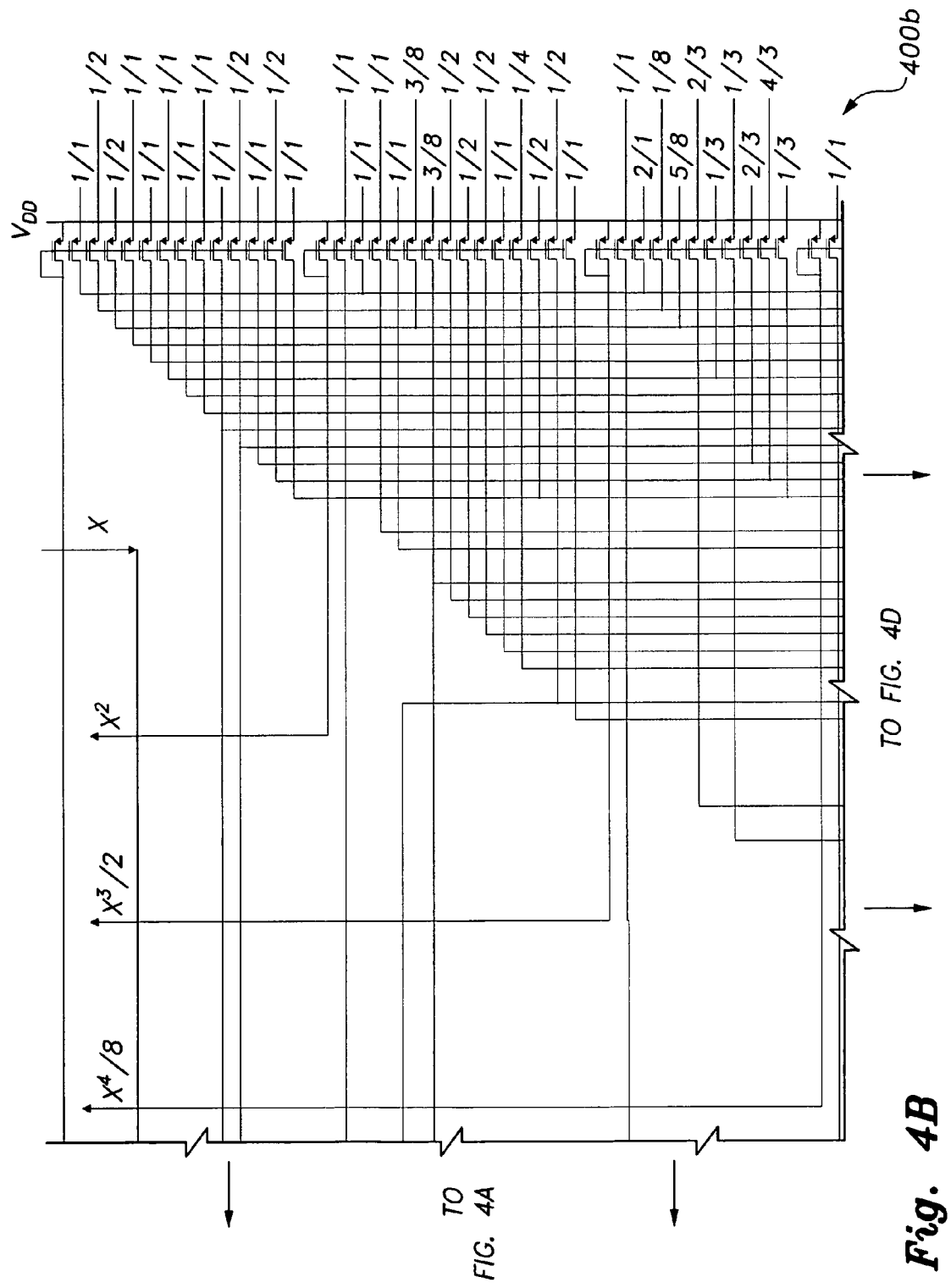
Figure 4C:
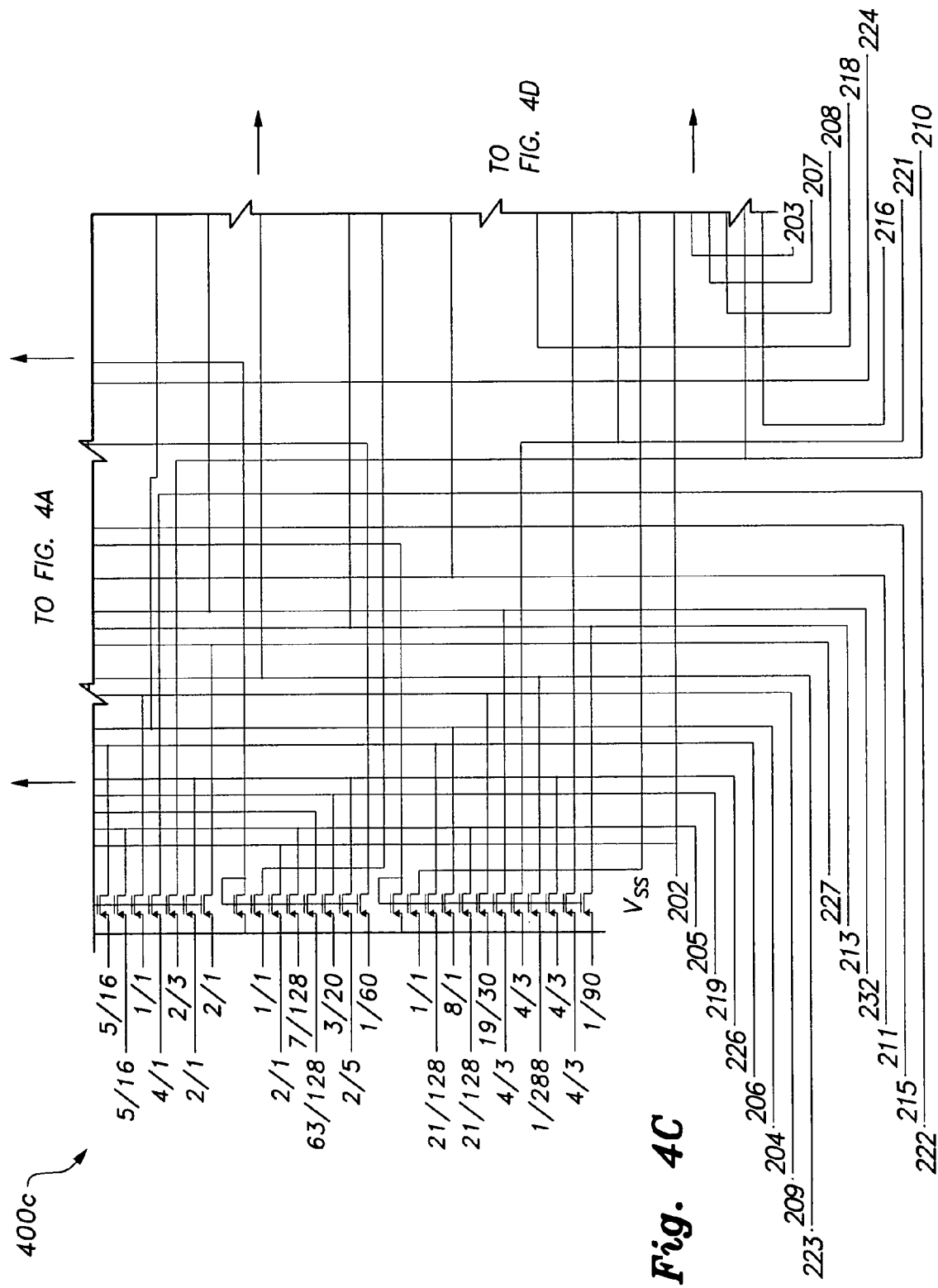
Figure 4D:
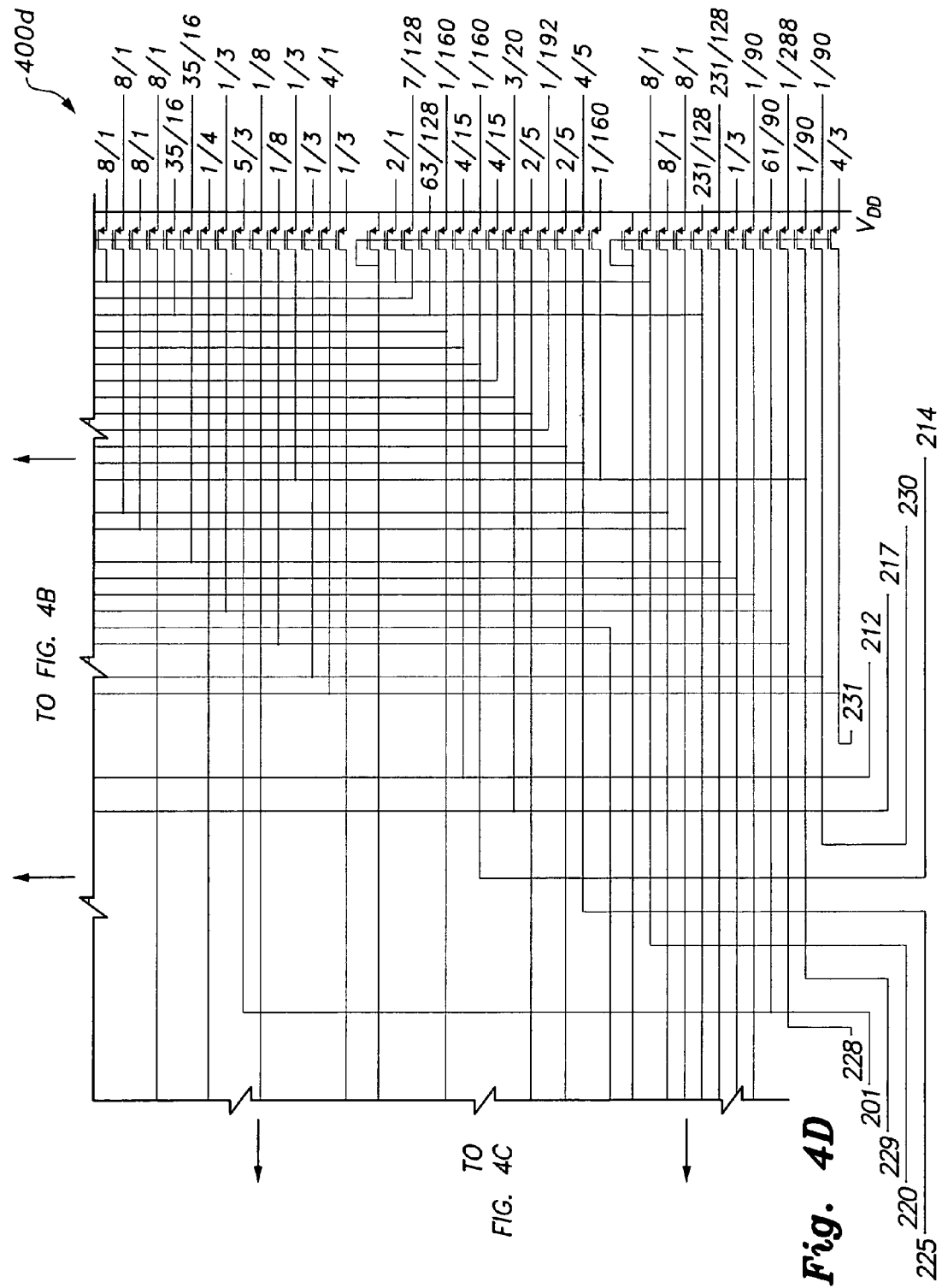

The aspect ratios (W/L) of transistors $M_1$-$M_8$ of FIG. 3 are the same as shown in Table 2. W/L is a geometric property of the transistor defined as the channel width of the Field Effect transistor (W) divided by its channel length (L). The weighting factor, $a_3$, of the normalized output current proportional to $x^3$ can be adjusted by proper selection of the aspect ratios (W/L) of additional MOSFET current mirrors.

Similarly, as shown in FIG. 2, a normalized current proportional to $x^5$ can be obtained using the square-difference identity with normalized input currents proportional to $x^2$ and $x^3$. The normalized current proportional to $x^4$ can be obtained using a squaring circuit input current proportional to $x^2$ and finally a normalized current proportional to $x^6$ can be obtained using another squaring circuit with normalized input current proportional to $x^3$.

Normalized currents proportional to higher powers of the normalized input current with different weighting factors can be obtained by successive use of squares and the square-difference identity and appropriate current-mirrors. Thus, higher-order terms of Equation (1) can be obtained using the already available design of the SU derived from FIG. 1 and shown in FIG. 3, and without recourse to a dedicated current multiplier.

Table III shows the aspect ratios (W/L) of the MOSFETs used to obtain the normalized currents x, $x^3/2$, $x^4/8$, $x^5/2$ and $x^6/8$. Using these normalized currents in addition to the appropriate normalized DC current component, any function in Table I can be realized using MOSFET current-mirrors with the appropriate aspect ratios (W/L).

TABLE III

| Transistor | W/L |
|---|---|
| M1-M16 | 1/1 |
| M21-M50 | 1/1 |
| M53-M75 | 1/1 |
| M77-M84 | 1/1 |
| M17-M20 | 8/1 |
| M51-M52 | 8/1 |
| M76 | 2/1 |

Figure 6:
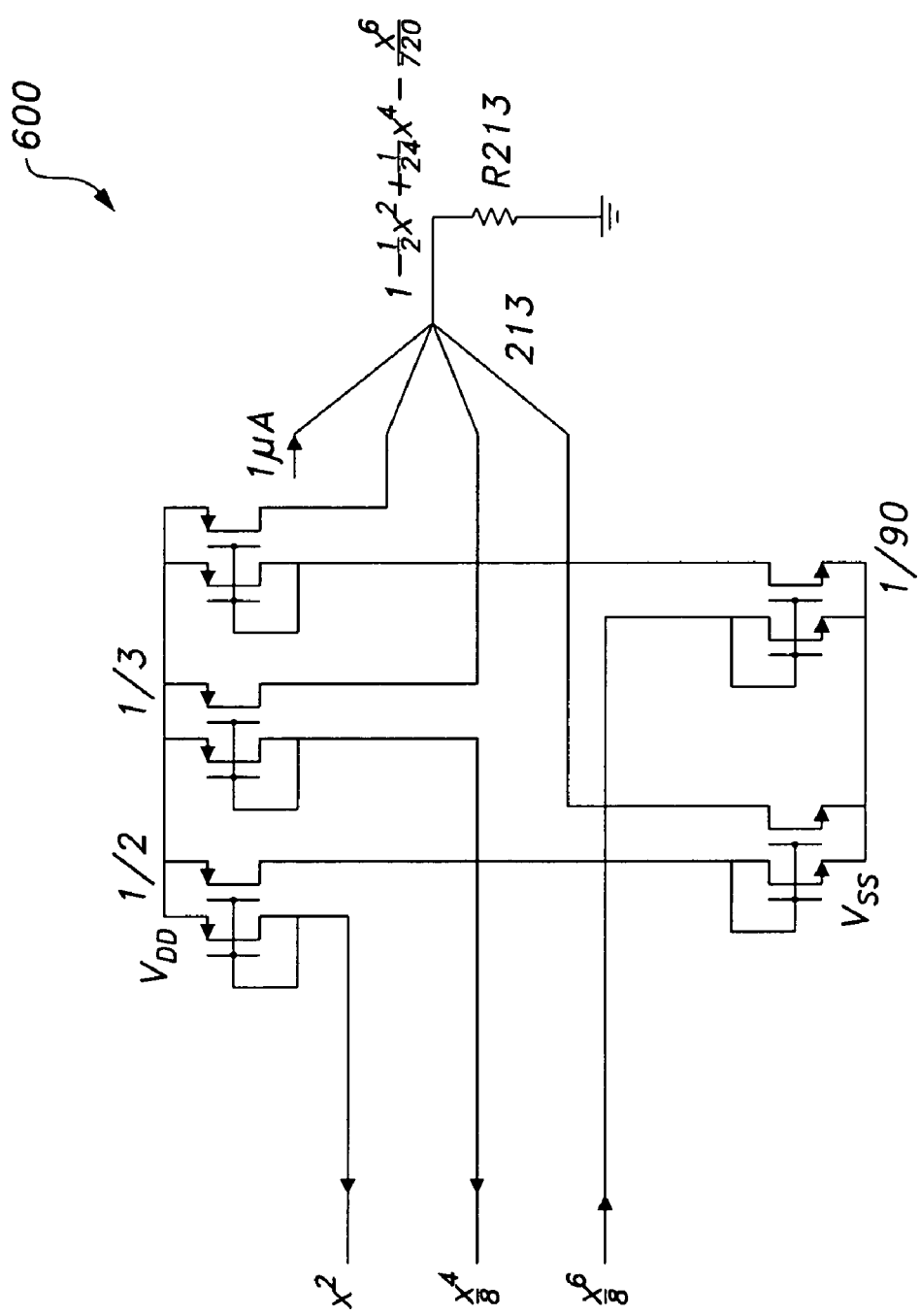
FIG. 6 is a block diagram of a y=cos(x) portion of the 32-by-32 function generator circuit.
Figure 7:
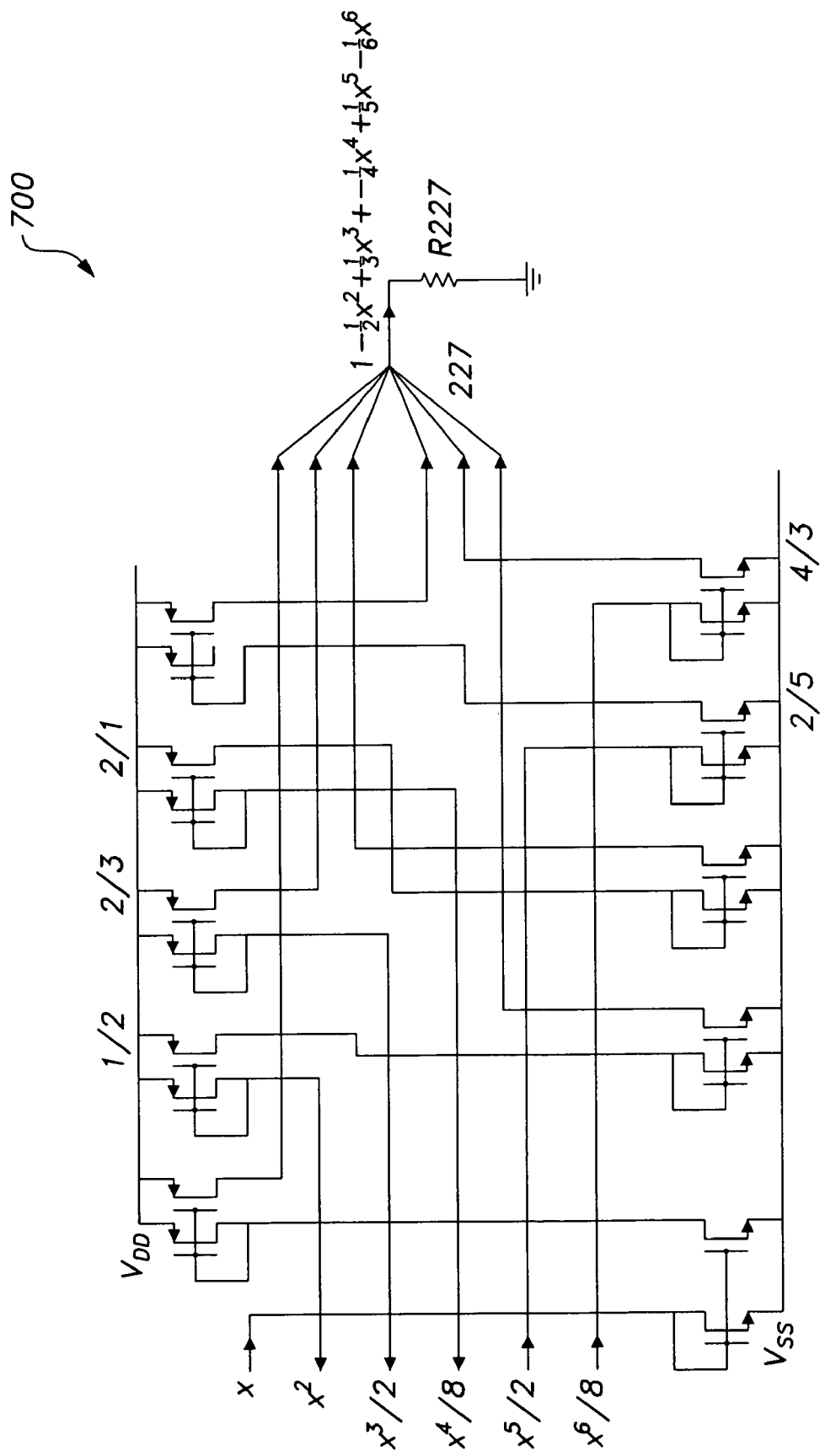
FIG. 7 is a block diagram of a y=ln(1+x) portion of the 32-by-32 function generator circuit.
Figure 8:
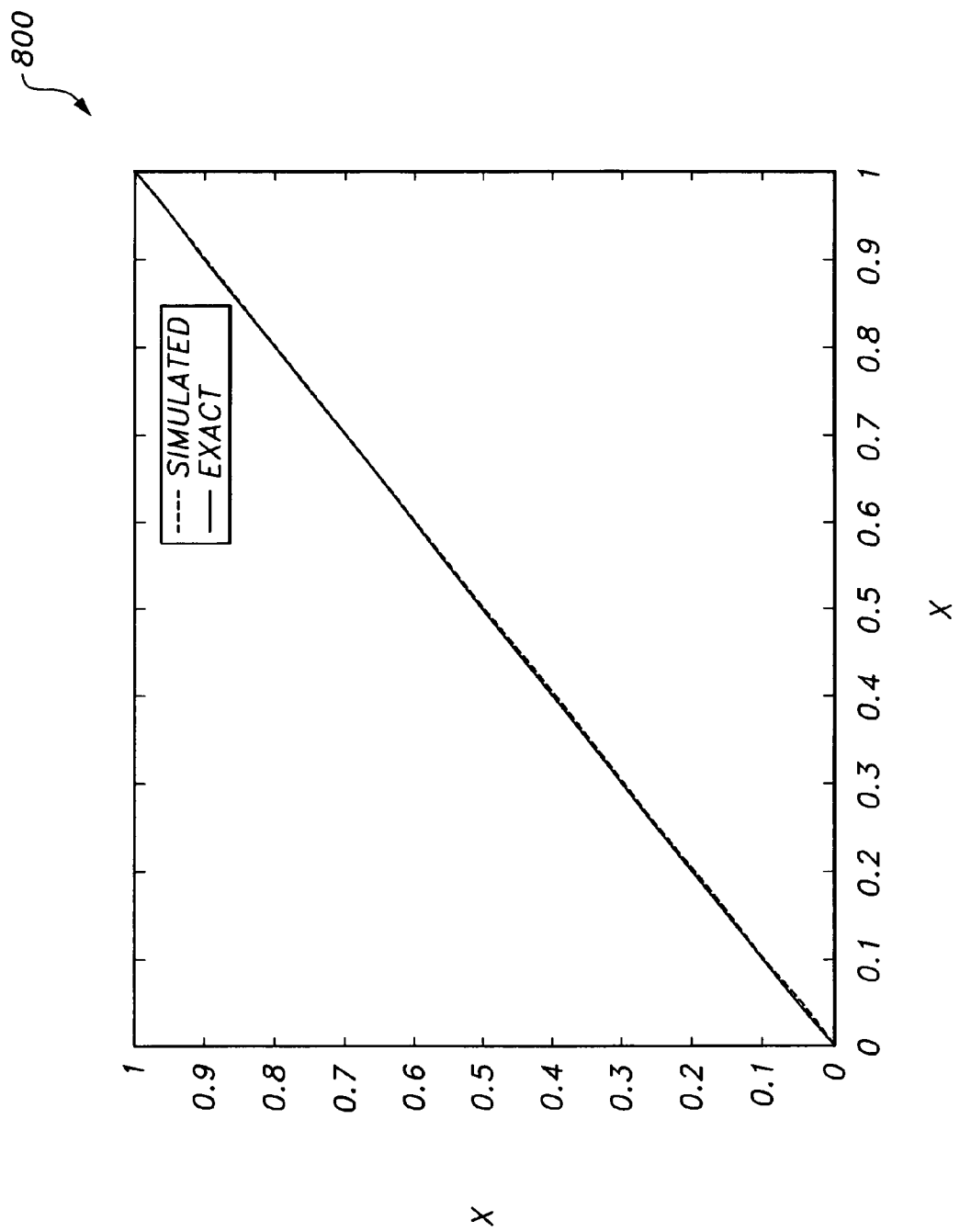
FIG. 8 is a plot showing calculated and simulated results obtained for the output current synthesizing y=x.
Figure 9:
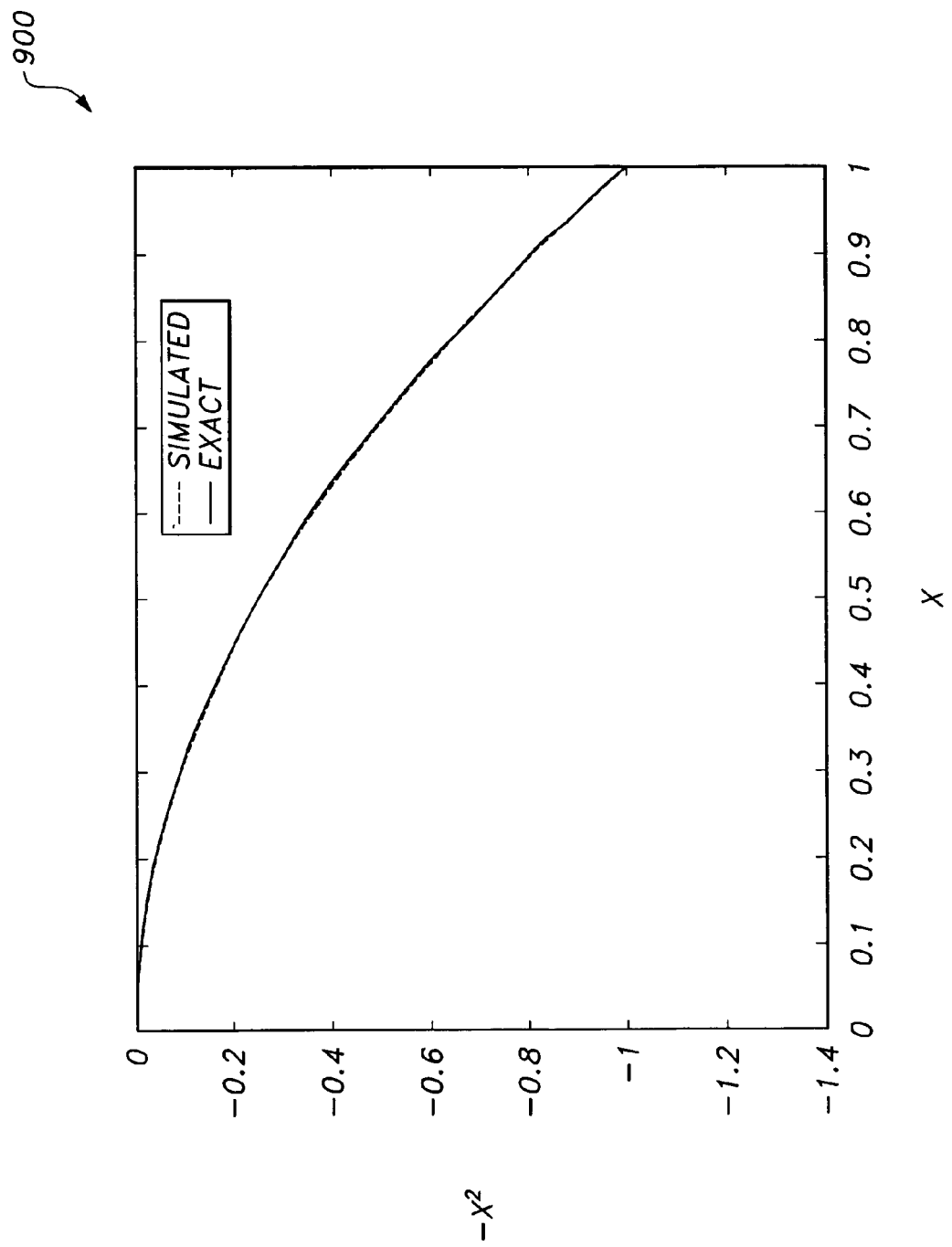
FIG. 9 is a plot showing calculated and simulated results obtained for the output current synthesizing (y=−x²/2).
Figure 10:
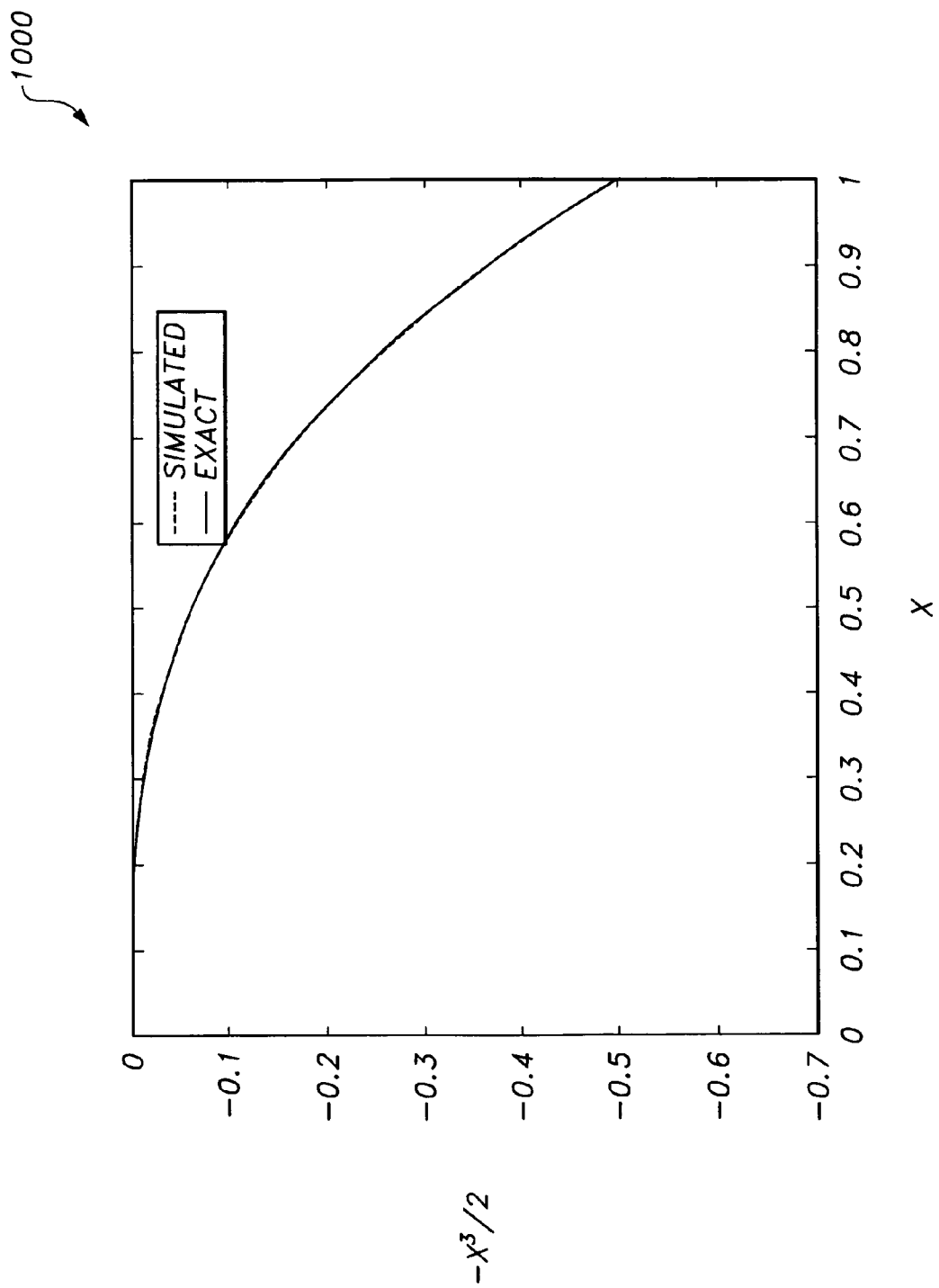
FIG. 10 is a plot showing calculated and simulated results obtained for the output current synthesizing (y=−x³/2).
Figure 11:
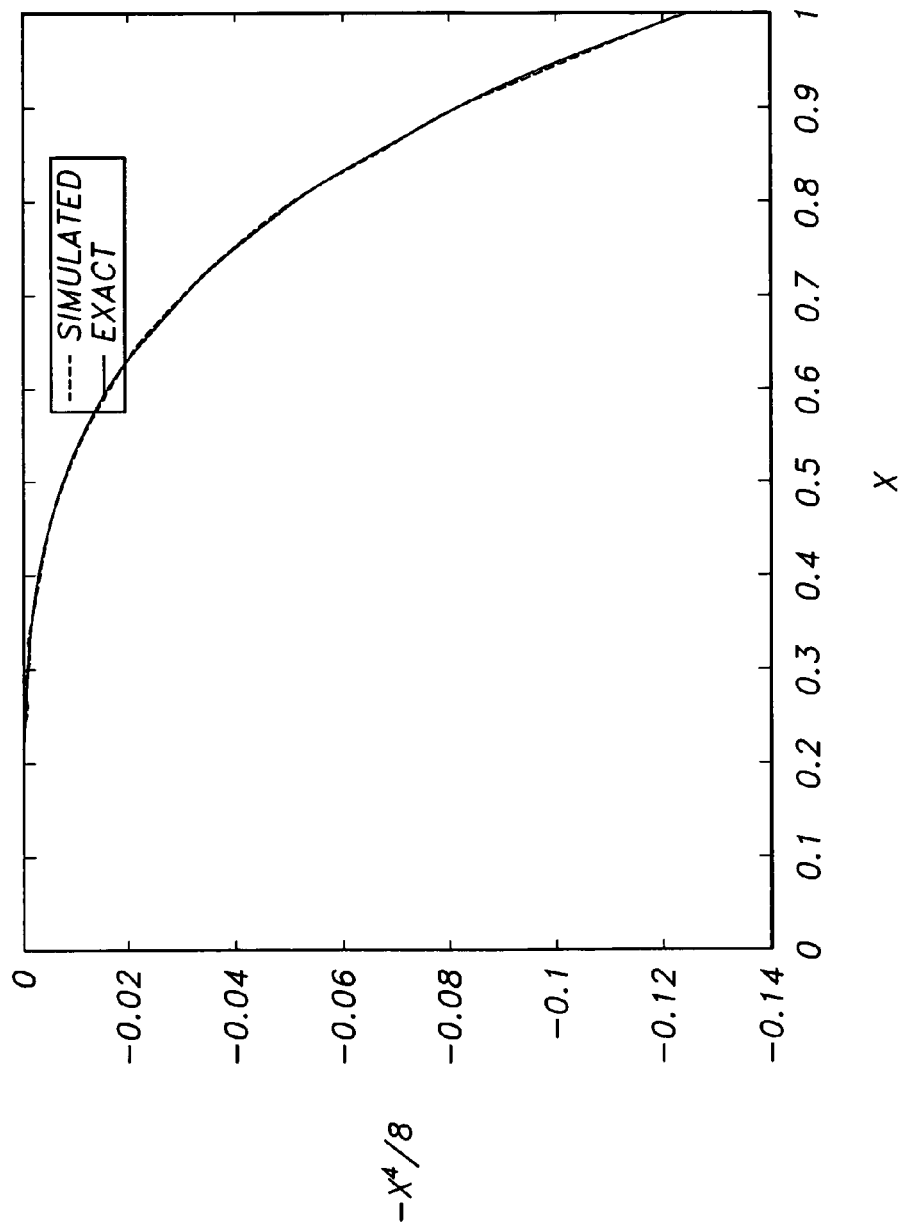
FIG. 11 is a plot showing calculated and simulated results obtained for the output current synthesizing (y=−x⁴/8).

A complete circuit realization for the thirty-two functions of Table I is shown in FIG. 4. To illustrate the described approach, FIG. 5 shows a circuit portion 500 of the sub-circuits used for realizing the function $y=(1-x)^{-1}$ wherein the current load accepted by R201 represents the Taylor Expansion for said function. Similarly, as shown in FIG. 6, circuit portion 600 realizes the function $y=\cos(x)$ wherein the current load accepted by R213 represents the Taylor Expansion for said function. Moreover, as shown in FIG. 7, circuit portion 700 realizes the function y=ln(1+x) wherein the current load accepted by R227 represents the Taylor Expansion for said function. Using Table 1, FIGS. 4-7 show the values of the aspect ratios (W/L) selected according to the values $a_n$, n=1, 2, ..., 6 of the desired nonlinear functions.

Figure 16:
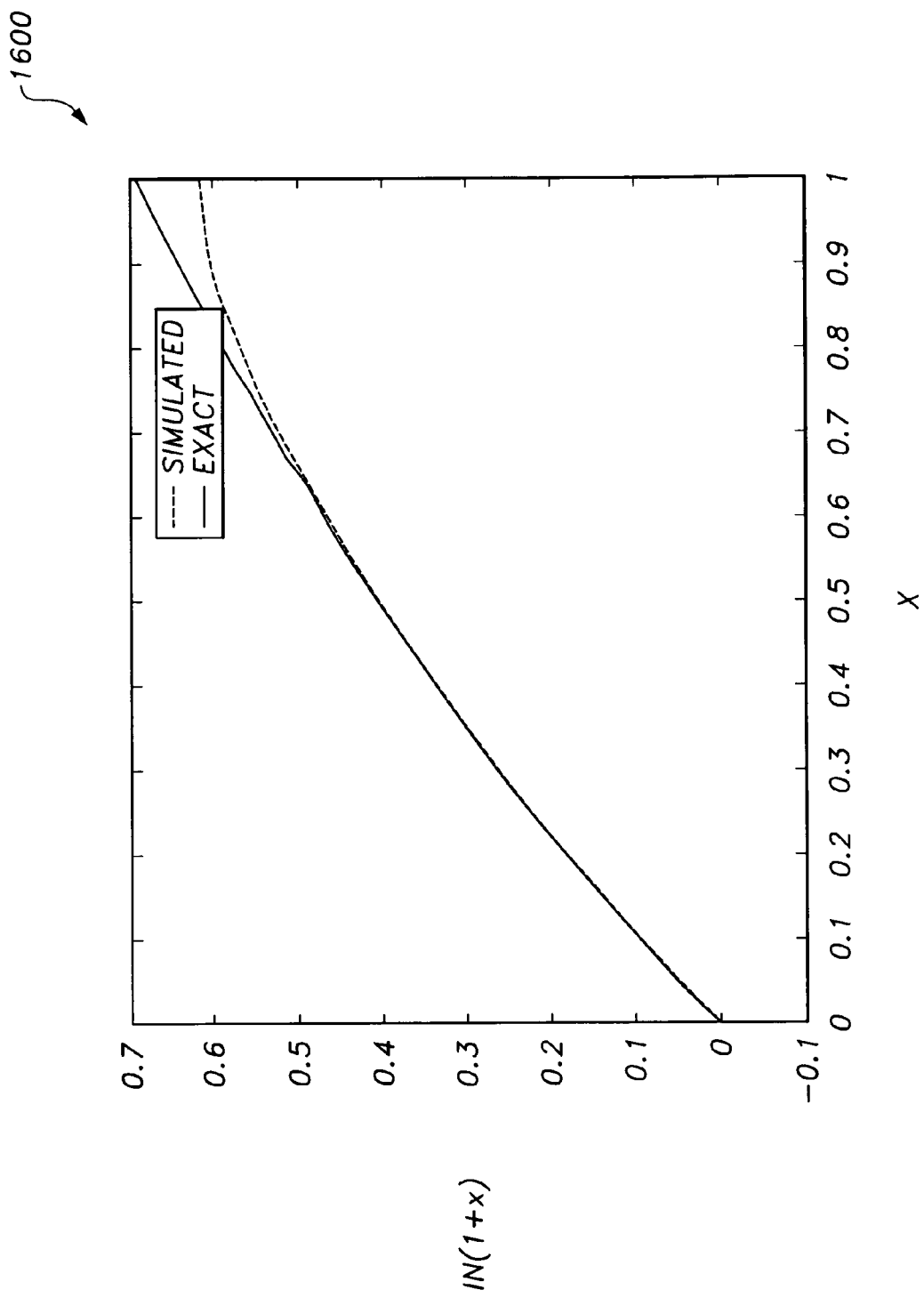
FIG. 16 is a plot showing calculated and simulated results obtained for the output current synthesizing function y=ln (1+).

The circuit of FIG. 2 was simulated with the HSPICE circuit simulation program using the BSIM2 level 39 MOSFET transistor models with L=0.1 µm, bias current $I_q$=1 uA and supply voltages $V_{DD}$=$-V_{SS}$=2V. With the input current changing between 0.0 µA and 1 µA, the output currents through load resistances $A_{L1}$=$R_{L2}$=100 kΩ were monitored. The results are shown in FIGS. 8-13 and Table IV.

y=cos(x) the error is less than 1% for values of x≦1.0 corresponding to $I_{in}$≦1.0 µA and inspection of plot 1600 in FIG. 16 shows that for the function y=ln(1+x) the error is less than 1% for x≦0.675 corresponding to $I_{in}$≦0.675 µA and less than 5% for values of x≦0.875 corresponding to $I_{in}$≦0.875 µA. Similar results, shown in Table V, were obtained from the simulation of FIG. 4 for the thirty-two functions tabulated in Table I.

The outputs of the circuit of FIG. 2 were used as inputs to the circuits of FIGS. 4-7.

TABLE IV

| x | | 0 | .2 | .4 | .6 | .8 | 1 |
|---|---|---|---|---|---|---|---|
| | Exact | 0 | .2 | .4 | .6 | .8 | 1 |
| | Simulated | .000008 | .200008 | .400008 | .600008 | .800008 | 1 |
| $-x^2$ | Exact | 0 | −.04 | −.16 | −.36 | −.64 | −1 |
| | Simulated | −.00034 | −.04035 | −.16035 | −.36036 | −.64036 | −1.0004 |
| $-\frac{x^3}{2}$ | Exact | 0 | −.004 | −.032 | −.108 | −.256 | .5 |
| | Simulated | −.000008 | −.004045 | −.03208 | −.10812 | −.25616 | −.5002 |
| $-\frac{x^4}{8}$ | Exact | 0 | −.0002 | −.0032 | −.0162 | −.0512 | −.125 |
| | Simulated | −.000053 | −.00026 | −.00326 | −.016285 | −.05131 | −.12514 |
| $\frac{x^5}{2}$ | Exact | 0 | .00016 | .00512 | .03888 | .16384 | .5 |
| | Simulated | −.000017 | .000182 | .005198 | .03905 | .16415 | .5005 |
| $\frac{x^6}{8}$ | Exact | 0 | .000008 | .000512 | .00583 | .03277 | .125 |
| | Simulated | .000036 | .000043 | .00055 | .00588 | .03284 | .125 |

Figure 12:
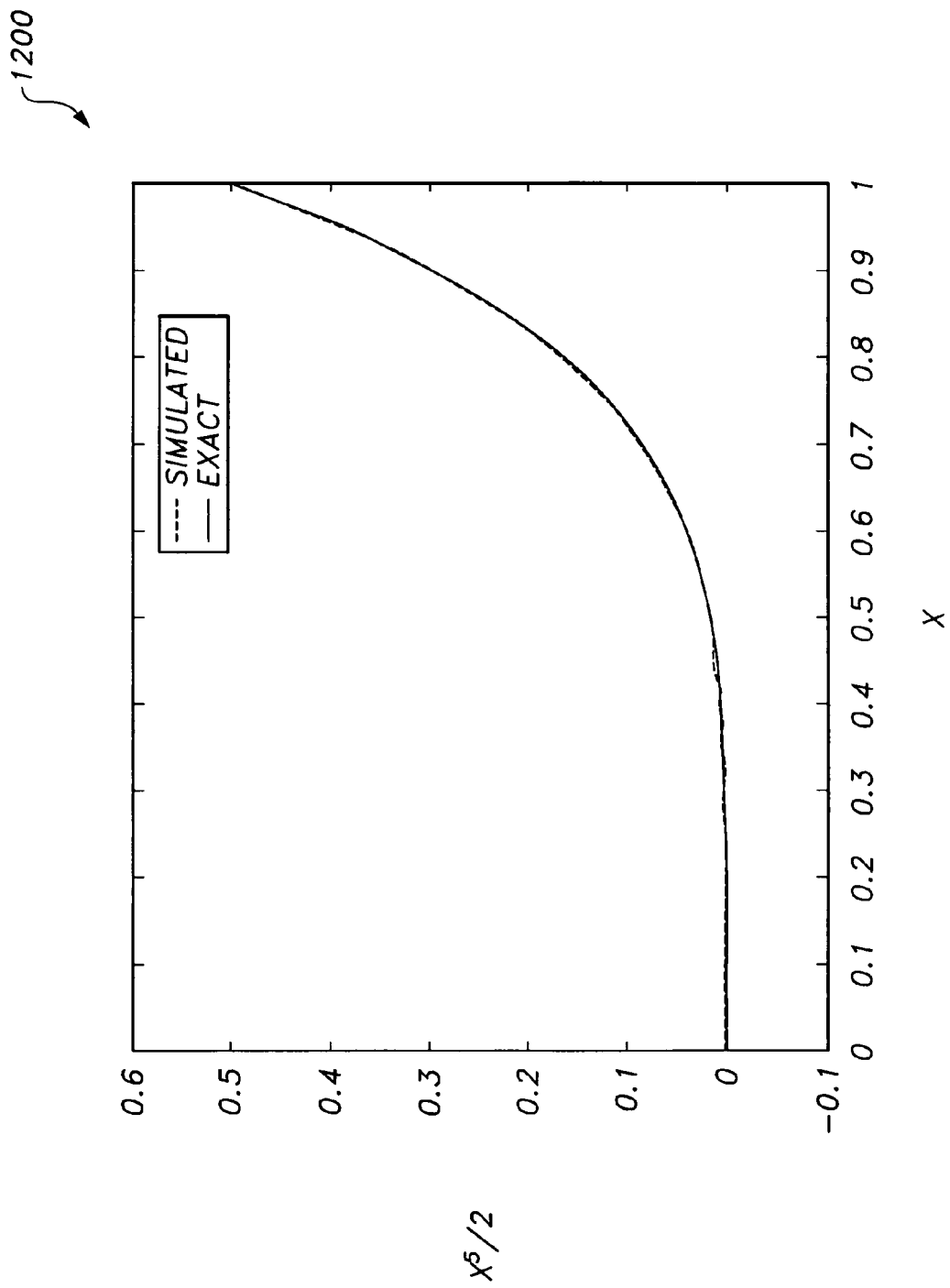
FIG. 12 is a plot showing calculated and simulated results obtained for the output current synthesizing (y=x⁵/2).
Figure 13:
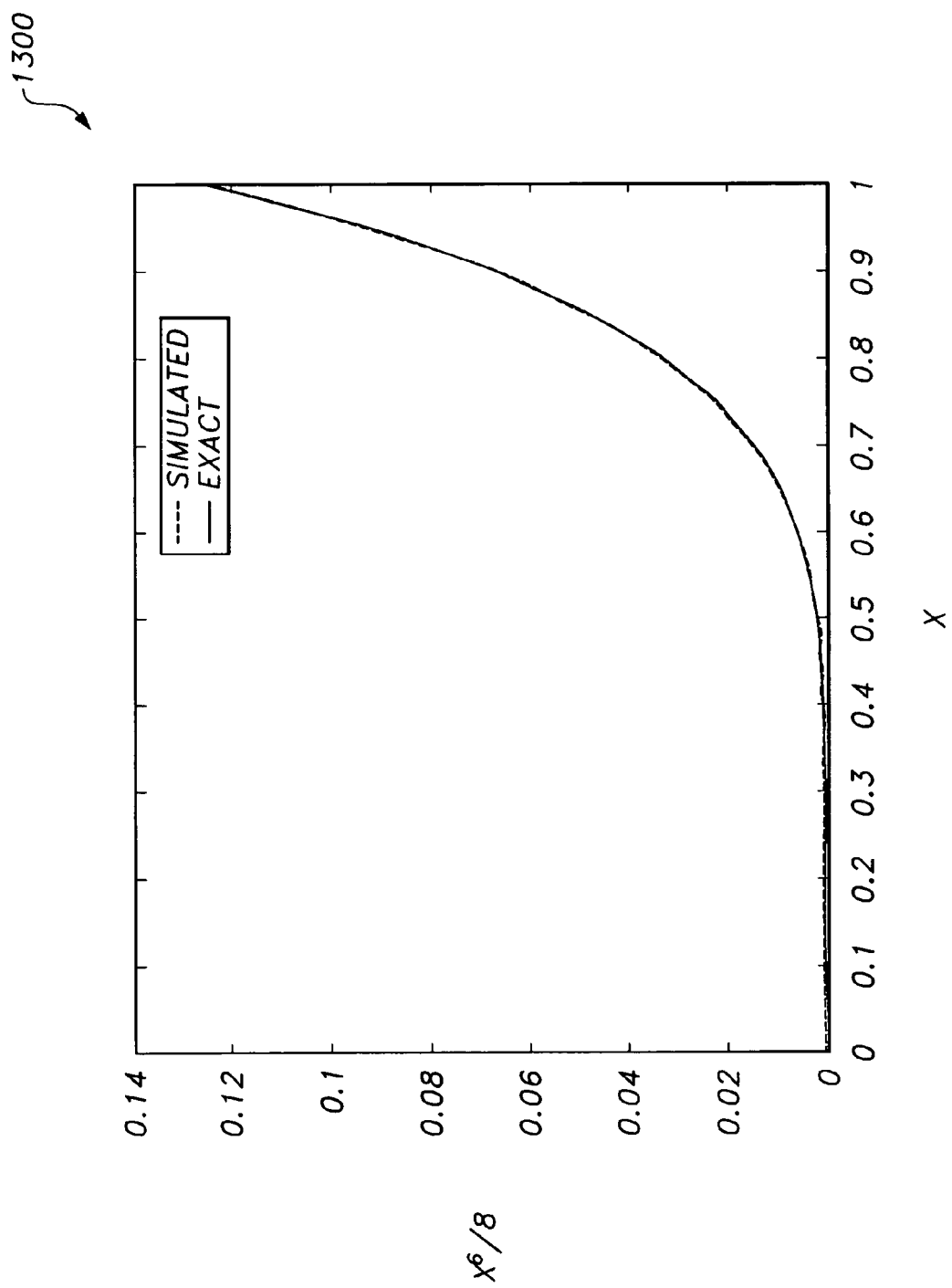
FIG. 13 is a plot showing calculated and simulated results obtained for the output current synthesizing (y=x⁶/8).

In FIGS. 8-13 all input and output currents are in microamperes. Inspection of FIGS. 8-13 and Table IV clearly shows that the simulated results are in excellent agreement with the calculated ones. For example, as shown in plot 800 of FIG. 8, the version of the function y=x synthesized by the present invention nearly identically matches the exact version of the function. As shown in plot 900 of FIG. 9, similar results were obtained for the function (y=$-x^2$/2). As shown in plot 1000 of FIG. 10, the function (y=$-x^3$/2) is faithfully synthesized by the present invention. Equally high fidelity results were obtained for synthesis of the function (y=$-x^4$/8) as shown in plot 1100 of FIG. 11. Plot 1200 of FIG. 12 shows the present invention synthesizing the function (y=$x^5$/2). Plot 1300 of FIG. 13 shows the present invention synthesizing the function y=$x^6$/8.

Figure 14:
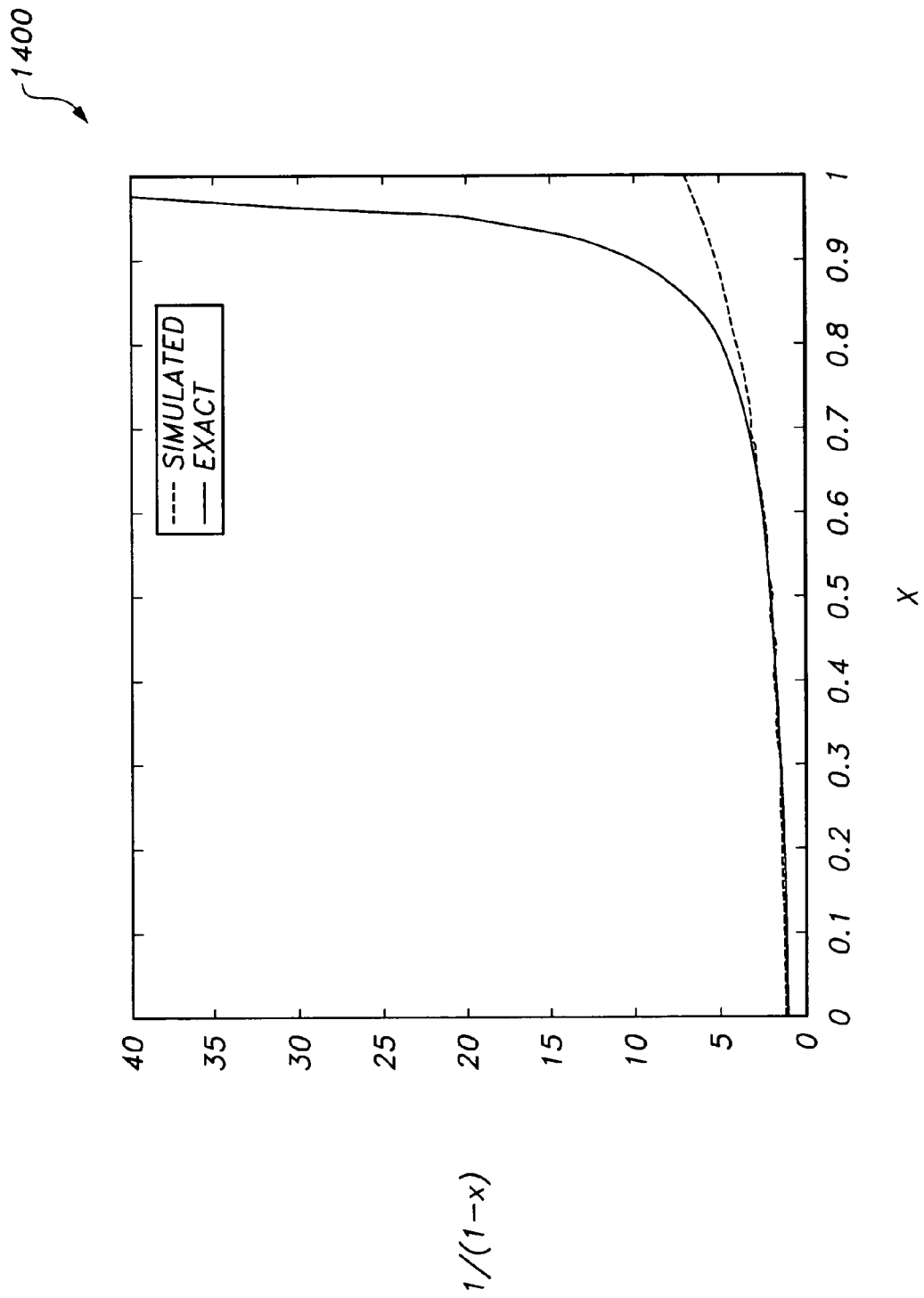
FIG. 14 is a plot showing calculated and simulated results obtained for the output current synthesizing y=(1−x)⁻¹.
Figure 15:
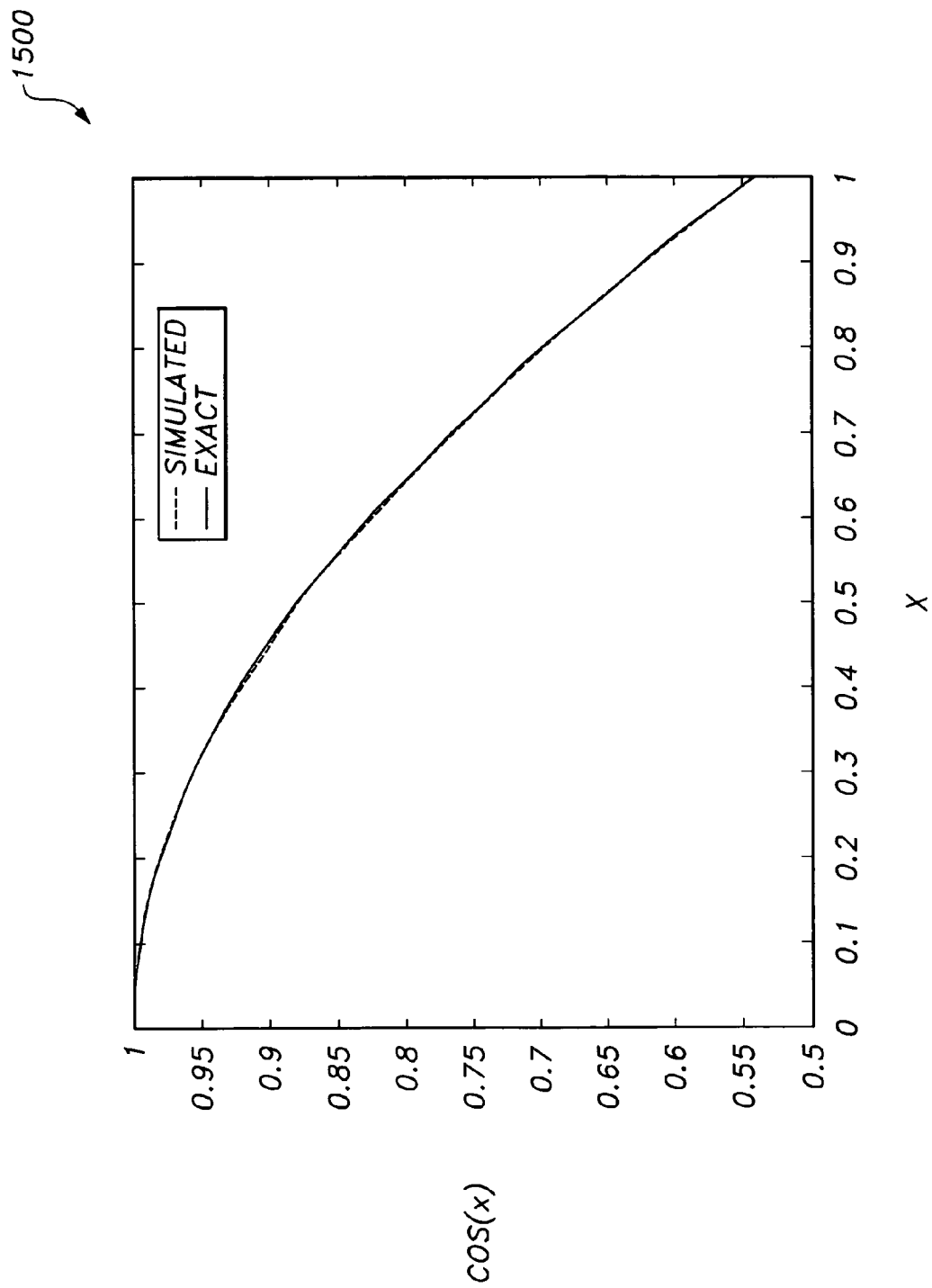
FIG. 15 is a plot showing calculated and simulated results obtained for the output current synthesizing y=cos(x).

The outputs of the circuit of FIG. 2 were used as inputs to the circuits of FIGS. 4-7. Samples of the results are shown in FIGS. 14-16 and a summary of the results is given Table V where the output is the voltage across a load resistance=1 MΩ. In FIGS. 14-16 all input currents are in microampere and all outputs are in volts. Whenever necessary, a DC current source=1 µA was added to the output node. This DC current source represents the constant term, $a_0$ of equation (1), which equals, according to Table I, either to 1 or zero. Inspection of plot 1400 in FIG. 14 clearly shows that for the function y=1/(1−x) the error is less than 1% for values of x≦0.5 corresponding to $I_{in}$≦0.5 µA and is less than 5% for values of x≦0.66 corresponding to $I_{in}$≦0.66 µA. Similarly, inspection of plot 1500 in FIG. 15 clearly shows that for the function

TABLE V

| Outlet number | Function | Max input for error = 1% | Max input for error =5% |
|---|---|---|---|
| 201 | $\frac{1}{1-x}$ | 0.5 µA | .66 µA |
| 202 | $\frac{1}{1+x}$ | 0.5 µA | .66 µA |
| 203 | $\frac{1}{1-x^2}$ | 0.575 µA | .7 µA |
| 204 | $\frac{1}{1+x^2}$ | 0.575 µA | .7 µA |
| 205 | $\sqrt{1-x}$ | 0.725 µA | .875 µA |
| 206 | $\sqrt{1+x}$ | 1.0 µA | 1.0 µA |
| 207 | $\frac{1}{\sqrt{1-x}}$ | 0.625 µA | .75 µA |
| 208 | $\frac{1}{\sqrt{1+x}}$ | 0.675 µA | .85 µA |
| 209 | $\sqrt{1+x^2}$ | 0.785 µA | .875 µA |
| 210 | $\sqrt{1+x^2}$ | 0.75 µA | 1.0 µA |
| 211 | sin(x) | 1.0 µA | 1.0 µA |
| 212 | tan(x) | 0.76 µA | 0.975 µA |
| 213 | cos(x) | 1.0 µA | 1.0 µA |
| 214 | sinh(x) | 1.0 µA | 1.0 µA |

TABLE V-continued

| Outlet number | Function | Max input for error = 1% | Max input for error =5% |
|---|---|---|---|
| 215 | tanh(x) | 1.0 μA | 1.0 μA |
| 216 | cosh(x) | 1.01 μA | 1.0 μA |
| 217 | $\sin^{-1}(x)$ | 0.73 μA | 0.9 μA |
| 218 | $\tan^{-1}(x)$ | 0.655 μA | 0.875 μA |
| 219 | $\cos^{-1}(x)$ | 0.73 μA | 0.845 μA |
| 220 | $\sec^{-1}(x)$ | 1.0p μA | 1.0 μA |
| 221 | $\sin(x^2)$ | 1.0 μA | 1.0 μA |
| 222 | $\cos(x^2)$ | 0.8 μA | 0.96 μA |
| 223 | $J_0(x)$ | 1.0 μA | 1.0 μA |
| 224 | $J_1(x)$ | 1.0 μA | 1.0 μA |
| 252 | $I_0(x)$ | 1.0 μA | 1.0 μA |
| 226 | $\ln(1-x)$ | 0.625 μA | 0.775 μA |
| 227 | $\ln(1+x)$ | 0.675 μA | 0.85 μA |
| 228 | $\ln\left[\frac{1+x}{1-x}\right]$ | 0.625 μA | 0.8 μA |
| 229 | $e^x$ | 1.0 μA | 1.0 μA |
| 230 | $e^{-x}$ | 1.0 μA | 1.0 μA |
| 231 | $e^{x^2}$ | 0.925 μA | 1.0 μA |
| 232 | $e^{-x^2}$ | 0.8 μA | 0.95 μA |

The SU plays a key role in the realization of the analog function synthesizer. Therefore, it is essential to investigate its performance in detail. The analysis presented above is based on the assumption that the transistors $M_1$-$M_4$, of the class-AB configuration of FIG. 3, are operating in saturation region, characterized by the perfect square-law equation, the process transconductance parameters $K_n$ and $K_p$, are equal, and the threshold voltages $V_{thi}$, i=1-4 of the n- and p-channel MOSFET transistors are equal. It is well known that, for long channel MOS transistors, the perfect square-law equation agrees well with experimental results. This, however, may not be the case for small channel lengths due to the second-order effects, such as channel length modulation, body effect, velocity saturation and mobility reduction.

A minimum gate length, which largely avoids short channel effects due to mobility reduction and velocity saturation, is, therefore, recommended to avoid destroying the square-law equation. Consequently, this minimum gate length ultimately limits the maximum operating frequency of the analog function synthesizer. Mismatch between the process transconductance parameters $K_n$ and $K_p$, the aspect ratios (W/L), and the threshold voltages $V_{thi}$, i=1-4 of the n- and p-channel MOS transistors of the class-AB configuration of FIG. 3 are, therefore, considered as the major contributors to the errors from the ideal performance. In the following subsections, the effects of the mismatch in threshold voltages, process transconductance parameters and the aspect ratios are considered in detail.

Assuming that transistors $M_1$-$M_4$ have threshold voltage mismatches, refinement of the translinear loop formed of $M_1$-$M_4$ of FIG. 3 yields $$2\sqrt{I_q} + \sum_{i=1}^{4}\left(\sqrt{K}\,\Delta V_{thi}\right) = \sqrt{I_{D2}} + \sqrt{I_{D4}} \qquad (9)$$

where $K=K_n=K_p$, $I_{D2}$ and $I_{D4}$ are the currents in the drains of transistors $M_2$ and $M_4$, respectively, $$\sum_{i=1}^{4}\Delta V_{thi} = \Delta V_{th1} + \Delta V_{th3} - \Delta V_{th2} - \Delta V_{th4} \qquad (10)$$

and $$\Delta V_{thi} = V_{thi} - V_{th0} \qquad (11)$$

Combining Equations (3), (9)-(11) and using simple mathematical manipulations, the normalized output current of the SU can be expressed as $$\frac{I_A}{I_q} = \frac{1}{8}\left(\frac{x}{I_q}\right)^2 + \frac{1}{2I_q}\left(\sqrt{K}\sum_{i=1}^{4}\Delta V_{thi}\right)^2 + \sqrt{\frac{2}{I_q}}\left(\sqrt{K}\sum_{i=1}^{4}\Delta V_{thi}\right) - \frac{1}{32}\left(\frac{x}{I_q}\right)^2\frac{1}{I_q}\left(\sqrt{K}\sum_{i=1}^{4}\Delta V_{thi}\right)^2 - \frac{1}{4}\left(\frac{x}{I_q}\right)^2\sqrt{\frac{1}{2I_q}}\left(\sqrt{K}\sum_{i=1}^{4}\Delta V_{thi}\right) \qquad (12)$$

On the right-hand side of Equation (12), the first term represents the output current of the ideal SU; the second and third terms represent a DC offset output current and the fourth and fifth terms are proportional to the square of the input current and represent an error in the output of the SU. Using Equation (12), the amount of error can be estimated for different values of x. For example, for $V_{th0}$=0.2578V, $\Delta V_{th1}$=1 mV, $\Delta V_{th2}$=0.7 mV, $\Delta V_{th3}$=0.3 mV, $\Delta V_{th4}$=1.2 mV and K=4.0 μA/V², then for $I_{in}$=1 μA, $I_q$=1 μA that is x=1.0, the output current of the SU is 0.2 μA, whereas the expected output current assuming identical transistors, with no threshold-voltage mismatch is 0.125 μA. This represents 60% error and shows that a total threshold-voltage mismatch $\Sigma\Delta V_{thi}$=0.3% results in 60% error in the output current of the SU. This clearly indicates the importance of minimizing the threshold-voltages mismatches of the MOSFET transistors.

Assuming that transistors $M_1$-$M_4$ have transconductance parameters mismatch with $K_n \neq K_p$ where $K_n$ and $K_p$ of the n- and p-channel MOS transistors, re-analysis of the translinear loop formed of transistors $M_1$-$M_4$ of FIG. 3 yields:

$$\sqrt{\frac{I_q}{K_p}} + \sqrt{\frac{I_q}{K_n}} = \sqrt{\frac{I_{D2}}{K_n}} + \sqrt{\frac{I_{D4}}{K_p}} \qquad (13)$$

With $K_n$=K, $K_p$=K(1+δ), using the approximation $(1+x)^{-1/2} \approx 1 - 1/2 x$, if x<<1, ignoring terms containing $\delta^2$, combining Equations (3) and (13), the output current of the SU can be expressed as:

$$I_{D2}(16(1-2\Delta)I_q + 4\Delta x) = 16(1-2\Delta)I_q^2 + (1-4\Delta)x^2 - 8(1-3\Delta)I_q x \qquad (14)$$

where Δ=0.5δ. Assuming that $4(1-2\Delta)I_q >> \Delta x$, equation (14) yields the following expression for the second-order output current:

$$\frac{I_A}{I_q} \approx \left(\frac{1}{8} - \frac{\Delta}{4}\right)\left(\frac{x}{I_q}\right)^2 + \Delta\frac{x}{I_q} \quad (15)$$

Successive use of Equation (15), ignoring second-order effects, yields the following expressions for the third-, fourth-, fifth- and sixth-order normalized output currents:

$$\frac{I_B}{I_q} \approx 4\left(\frac{1}{8} - \frac{\Delta}{4}\right)\left(\frac{x}{I_q}\right)^3 + 2\Delta\frac{x}{I_q} \quad (16)$$

$$\frac{I_C}{I_q} \approx \left(\frac{1}{8} - \frac{\Delta}{4}\right)\left(\frac{x}{I_q}\right)^4 + \Delta\left(\frac{x}{I_q}\right)^2 \quad (17)$$

$$\frac{I_D}{I_q} \approx 4\left(\frac{1}{8} - \frac{\Delta}{4}\right)\left(\frac{x}{I_q}\right)^5 + 2\Delta\frac{x}{I_q} \quad (18)$$

and $$\frac{I_E}{I_q} \approx \left(\frac{1}{8} - \frac{\Delta}{4}\right)\left(\frac{x}{I_q}\right)^6 + \Delta\left(\frac{x}{I_q}\right)^3 \quad (19)$$

Equations (15)-(19) clearly show that the normalized output currents $I_A$, $I_B$, $I_C$, $I_D$, and $I_E$ will be affected by the mismatch of the process transconductance parameters $K_n$ and $K_p$. In fact each of the currents $I_A$, $I_B$, and $I_D$, are comprised of the required second-, third- and fifth-order components plus a linear one. And the currents $I_C$ and $I_E$ are comprise of the required fourth- and sixth-order components plus a second-order and a third-order component, respectively. Obviously, this will lead to error in the synthesized analog function.

To illustrate the amount of error, consider the following example. To synthesize the function:

$$y = e^x \approx 1 + x + \frac{1}{2}x^2 + \frac{1}{6}x^3 + \frac{1}{24}x^4 + \frac{1}{120}x^5 + \frac{1}{720}x^6 \quad (20)$$

the current $I_A$ must be inverted and multiplied by 4, and the current $I_B$ must be divided by 3, the current $I_C$ must be divided by 3, the current $I_D$ must be divided by 60 and the current $I_E$ must be divided by 90. Thus, using Equations (15)-(19), and assuming that the current $I_q$=1 uA, the output current will be given by:

$$y \approx 1 + x(1 + 4.7\Delta) + \left(\frac{1}{2} - \frac{2}{3}\Delta\right)x^2 + \left(\frac{1}{6} - \frac{13}{90}\Delta\right)x^3 + \left(\frac{1}{24} - \frac{\Delta}{12}\right)x^4 + \left(\frac{1}{120} - \frac{\Delta}{240}\right)x^5 + \left(\frac{1}{720} - \frac{\Delta}{360}\right)x^6 \quad (21)$$

For any value of $\Delta$, using (21), the amount of error can be estimated for different values of x. For example, for $\Delta$=0.05, that is 10% transconductance mismatch, x=0.2, the output will be 1.261139, that is $e^{0.2} \approx 1.261139$. The exact value is 1.2214. Thus, the error due to the transconductance mismatch is 3.25%.

Assuming that transistors $M_1$-$M_4$ have aspect ratios mismatch with $(W/L)_1 \neq (W/L)_2 \neq (W/L)_3 \neq (W/L)_4$, re-analysis of the translinear loop formed of $M_1$-$M_4$ in FIG. 3 yields:

$$\sqrt{\frac{I_q}{(W/L)_1}} + \sqrt{\frac{I_q}{(W/L)_3}} = \sqrt{\frac{I_{D2}}{(W/L)_2}} + \sqrt{\frac{I_{D4}}{(W/L)_4}} \quad (22)$$

With $(W/L)_i = (W/L)(1+\delta_i)$, i=1, 2, 3, 4, using the approximation $(1+x)^{-1/2} \approx 1-1/2x$, if x<<1, ignoring terms containing $\delta_i^2$, Equation (22) reduces to $$\sqrt{I_q}\left(1 - \frac{1}{2}\delta_1\right) + \sqrt{I_q}\left(1 - \frac{1}{2}\delta_3\right) = \sqrt{I_{D2}}\left(1 - \frac{1}{2}\delta_2\right) + \sqrt{I_{D4}}\left(1 - \frac{1}{2}\delta_4\right) \quad (23)$$

Combining Equations (3) and (23), simple mathematical manipulations lead to the following approximate expression for the output current of the SU, after subtracting the current $2I_q$.

$$\frac{I_A}{I_q} = \quad (24)$$

$$\frac{1}{\left(\frac{\alpha_1}{\alpha_3}\right)^2 + \left(\frac{\alpha_2}{\alpha_3}\right)^2} - 2 + \frac{\left(\frac{\alpha_2}{\alpha_3}\right)^4}{\left[\left(\frac{\alpha_1}{\alpha_3}\right)^2 + \left(\frac{\alpha_2}{\alpha_3}\right)^2\right]^2}\left(\frac{x}{I_q}\right)^2 + \frac{\left(\frac{\alpha_1}{\alpha_3}\right)^2 - \left(\frac{\alpha_2}{\alpha_3}\right)^2}{\left(\frac{\alpha_1}{\alpha_3}\right)^2 + \left(\frac{\alpha_2}{\alpha_3}\right)^2}\left(\frac{x}{I_q}\right)$$

where $=\alpha_1=(1-1/2\delta_2)$, $\alpha_2=(1-1/2\delta_4)$ and $\alpha_3=2-1/2(\delta_1+\delta_3)$. On the right hand side of Equation (24), the first two terms represent a DC offset in the normalized output current of the SU, the third term represents the required output of the SU; now modified, and the fourth term is proportional to the normalized input current and represents an error in the output of the SU. For any values of $\delta_1$, $\delta_2$, $\delta_3$ and $\delta_4$ the error can be estimated for different values of x. For example, for $\delta_1$=0.1, $\delta_2$=0.05, $\delta_3$=0.07 and $\delta_4$=0.06, then the normalized output current of the SU will have an undesired DC offset component equal to 0.1 instead of zero in the ideal case, the coefficient of the square of the normalized output current will be 1/7.9997 instead of the exact value=1/8 and an undesired output component proportional to the normalized input with coefficient=0.0208. This clearly indicates that the output of the SU will be slightly affected by the mismatches in the aspect ratios W/L.

A simple technique for synthesizing nonlinear functions has been presented. This technique is based on approximating the nonlinear function of interest using the first seven terms in its Taylor-series expansion. The desired function is the summation of the weighted output currents of a number of power-factor raising circuits built around a basic current squarer circuit (SU), a weighted current amplifier (or attenuator) and a DC current component. The technique is very flexible and can simultaneously realize many functions by proper selection of the aspect ratios of MOSFET transistors. Adding higher-order terms to the Taylor series requires the use of additional power-factor raising circuits, which can be easily realized using the current squarer circuit (SU). The simulation results, obtained from the thirty-two functions, verified the operation of the circuit.

The accuracy of the synthesized functions will be primarily decided by the number of Taylor-series terms used in the approximation and the effects of mismatch between transistors used in practical implementation of the required current power-factor raising circuits built around the SU of FIG. 3 and the current-mirrors. The effect of threshold-voltage mismatches, process transconductance parameters mismatches, and aspect ratios mismatches have been studied in detail. The results clearly show that the threshold-voltage mismatches are the major contributors to the errors in the realization of the nonlinear functions reported in this article. Monte Carlo simulations performed on all the thirty-two functions confirmed this conclusion. Moreover, Monte Carlo simulations performed on the thirty-two functions clearly show that for most of the functions, the change of temperature from −35° C. to 85° C. will have a slight effect on the performance of the nonlinear function synthesizer. Also, the change of DC power supply within ±10% has a negligible effect on the performance of the circuit.

The high frequency limitations of the analog function synthesizer will be decided by the high frequency performance of the class-AB configuration of FIGS. 1 and 3 and the current mirrors. Approximate analysis shows that the dominant high-frequency pole of the class-AB configuration is around 175.36 MHz and the dominant high-frequency pole of the current mirror is around 28.43 MHz. It appears, therefore, that the high frequency performance of the analog function synthesizer (400a, 400b, 400c, 400d) is expected to be around 25 MHz, which is appropriate for many applications.

It is to be understood that the present invention is not limited to the embodiment described above, but encompasses any and all embodiments within the scope of the following claims.

We claim:

1. A universal CMOS current-mode analog function synthesizer, comprising:
   a current squarer circuit;
   power factor raising circuits connected to the current squarer circuit;
   a DC current source; and
   a weighted current amplifier connected to the DC current source, the power factor raising circuits, and the current squarer circuit, the weighted current amplifier summing outputs of the DC current source, the current squarer circuit and the power factor raising circuits, the weighted current amplifier having weights representing successive terms of a Taylor series expansion of a nonlinear function of interest;
   wherein a current output of the weighted current amplifier approximates the nonlinear function of interest using the weights representing the plurality of terms in the Taylor-series expansion of the function.

2. The universal CMOS current-mode analog function synthesizer according to claim 1, further comprising:
   a plurality of CMOS current squaring circuits arranged in rows, each row having a user selectable width-to-length ratio (W/L); and
   a plurality of nodes, each node selectively terminating a unique one of said rows, said nodes and said rows forming a function matrix wherein a plurality of functions are independently and concurrently realizable in said circuitry.

3. The universal CMOS current-mode analog function synthesizer according to claim 1, wherein the current squarer circuit has a first output current proportional to a normalized input current, and a second output current proportional to the square of the normalized input current.

4. The universal CMOS current-mode analog function synthesizer according to claim 1, wherein the current squarer circuit comprises a plurality of MOSFETS having a plurality of aspect ratios (w/L) selected to obtain any current of value $a_1 x$ or $a_2 x^2$, $a_1$ and $a_2$ being constants.

5. The universal CMOS current-mode analog function synthesizer according to claim 4, further comprising square-difference identity circuitry using the square-difference identity $[(A+B)^2-(A-B)^2=4AB]$, having an input which accepts a sum and difference of inputs $A=x$ and $B=x^2$, and having an output which provides a normalized current proportional to $x^3$.

6. The universal CMOS current-mode analog function synthesizer according to claim 5, further comprising pre-selected aspect ratios (W/L) in the associated square-difference identity circuitry, wherein a weighting factor $a_3$ of the normalized output current proportional to $x^3$ is adjustable.

7. The universal CMOS current-mode analog function synthesizer according to claim 4, further comprising square-difference identity circuitry using the square-difference identity $[(A+B)^2-(A-B)^2=4AB]$, having an input which accepts a sum and difference of inputs $A=x^2$ and $B=x^3$, and having an output which provides a normalized current proportional to $x^5$.

8. The universal CMOS current-mode analog function synthesizer according to claim 4, wherein an input to said current squarer circuit comprises a current proportional to $x^2$, thereby producing a normalized output current proportional to $x^4$.

9. The universal CMOS current-mode analog function synthesizer according to claim 4, wherein an input to said current squarer circuit comprises a current proportional to $x^3$, thereby producing a normalized output current proportional to $x^6$.

10. The universal CMOS current-mode analog function synthesizer according to claim 4, further comprising:
    successive stages of said current squarer circuit; and
    square-difference identity circuitry having successive stages, said successive stages of said square-difference identity circuitry being connected in combination with said successive stages of said squaring circuit, said combination having an output providing a normalized output current proportional to an arbitrary power of a normalized input current, each said normalized output current having a user selectable weighting factor without recourse to the use of a dedicated current multiplier.

* * * * *